(12) United States Patent
Hirai

(10) Patent No.: US 7,368,331 B2
(45) Date of Patent: May 6, 2008

(54) MANUFACTURING METHOD OF THIN-FILM TRANSISTOR, THIN-FILM TRANSISTOR SHEET, AND ELECTRIC CIRCUIT

(75) Inventor: Katsura Hirai, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 0 days.

(21) Appl. No.: 10/740,644

(22) Filed: Dec. 19, 2003

(65) Prior Publication Data

US 2004/0129978 A1   Jul. 8, 2004

(30) Foreign Application Priority Data

| Dec. 26, 2002 | (JP) | ............................. 2002-376792 |
| Mar. 24, 2003 | (JP) | ............................. 2003-079239 |
| Mar. 25, 2003 | (JP) | ............................. 2003-081960 |

(51) Int. Cl.
*H01L 29/04* (2006.01)

(52) U.S. Cl. .................... 438/149; 438/151; 257/72; 257/49; 257/59; 257/347; 257/E51.018; 257/E51.03; 257/E51.031; 257/E51.051; 257/E51.049; 257/E21.029; 257/E21.291

(58) Field of Classification Search ............... 438/149, 438/151; 257/40, 59, 347, 289, 72, 49
See application file for complete search history.

(56) References Cited

U.S. PATENT DOCUMENTS

| 6,586,791 | B1 * | 7/2003 | Lee et al. ................... 257/295 |
| 6,621,099 | B2 * | 9/2003 | Ong et al. ..................... 257/40 |
| 6,808,972 | B2 * | 10/2004 | Sirringhaus et al. ......... 438/200 |
| 7,018,872 | B2 * | 3/2006 | Hirai et al. .................. 438/149 |
| 7,061,010 | B2 * | 6/2006 | Minakata ...................... 257/40 |
| 7,081,641 | B2 * | 7/2006 | Kawasaki et al. ............. 257/40 |
| 2002/0171125 | A1 * | 11/2002 | Bao et al. .................... 257/642 |
| 2003/0059984 | A1 * | 3/2003 | Sirringhaus et al. ........ 438/141 |
| 2003/0102472 | A1 * | 6/2003 | Kelley et al. ................ 257/40 |
| 2004/0075093 | A1 * | 4/2004 | Arai et al. ..................... 257/66 |
| 2004/0247814 | A1 * | 12/2004 | Sirringhaus et al. ....... 428/64.1 |
| 2004/0253835 | A1 * | 12/2004 | Kawase ...................... 438/780 |

FOREIGN PATENT DOCUMENTS

| GB | 2-373-095 | 9/2002 |
| JP | 57-7549 | * 1/1982 |
| JP | 61-222179 | * 10/1986 |
| JP | 2003-282883 | * 10/2003 |
| WO | 01/47045 | 6/2001 |

OTHER PUBLICATIONS

European Search Report for European Patent Application No. 03028941.7-1235 mailed Sep. 25, 2007.
H. Sirringhaus et al., High-Resolution Inkjet Printing of All-Polymer Transistor Circuits, www.sciencemag.org, Dec. 15, 2000, vol. 290.

* cited by examiner

*Primary Examiner*—A. Sefer
(74) *Attorney, Agent, or Firm*—Cantor Colburn LLP

(57) ABSTRACT

A thin-film transistor, a thin-film transistor sheet, an electric circuit, and a manufacturing method thereof are disclosed, the method comprising the steps of forming a semiconductor layer by providing a semiconductive material on a substrate, b) forming an isolating area, which is electrode material-repellent, by providing an electrode material-repellent material on the substrate, and c) forming a source electrode on one end of the insulating area and a drain electrode on the other end of the insulating area, by providing an electrode material.

8 Claims, 18 Drawing Sheets

FIG. 3 - (1)
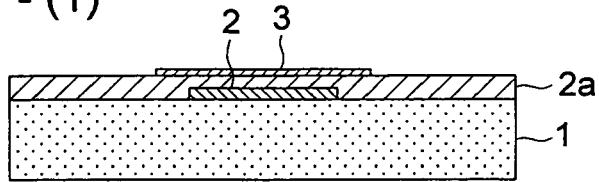
FIG. 3 - (2)
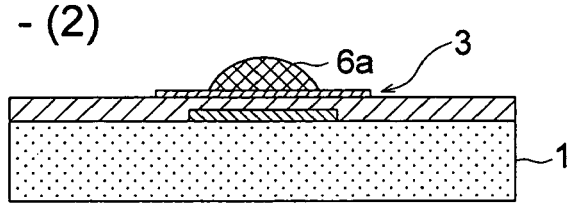
FIG. 3 - (3)
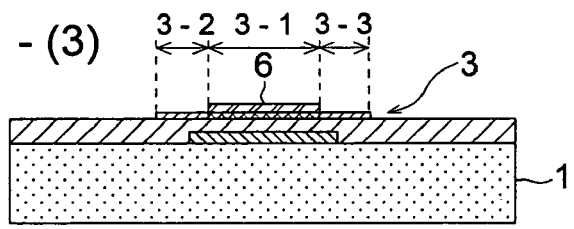
FIG. 3 - (4)
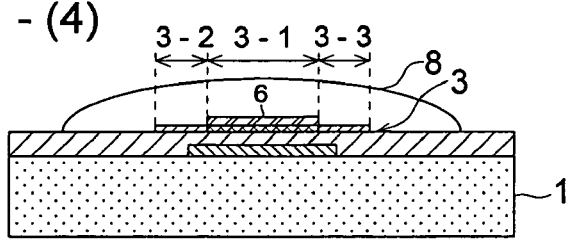
FIG. 3 - (5)
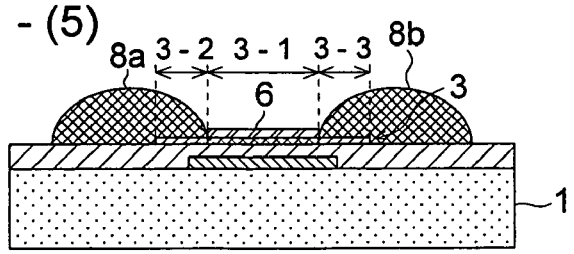
FIG. 3 - (6)
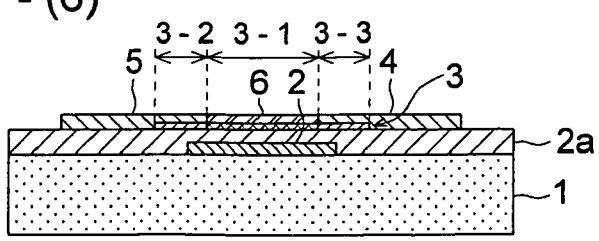

FIG. 6 (a)
FIG. 6 (b)
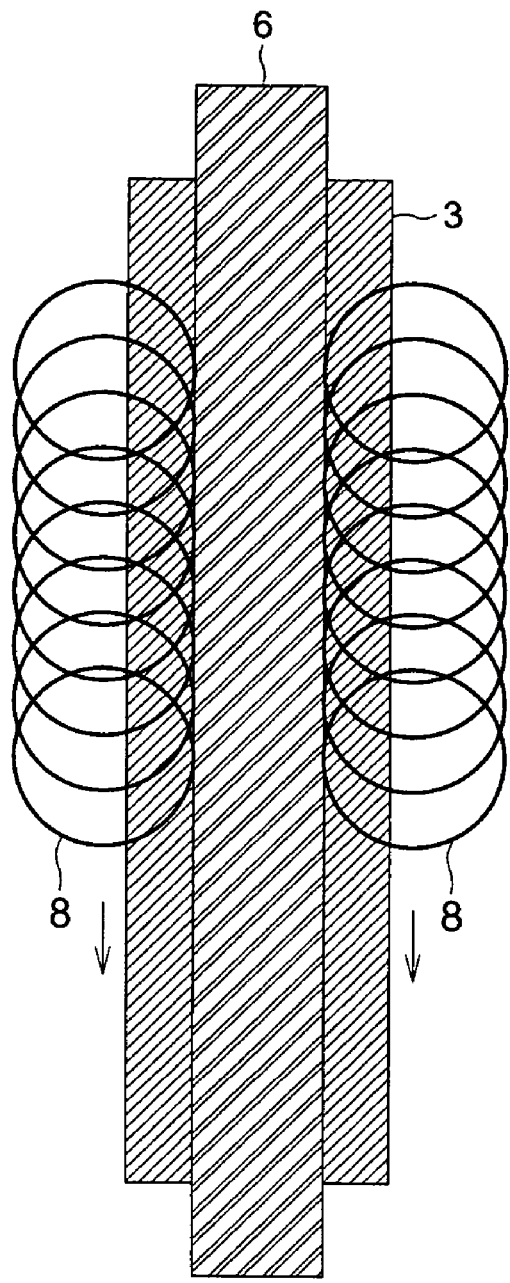
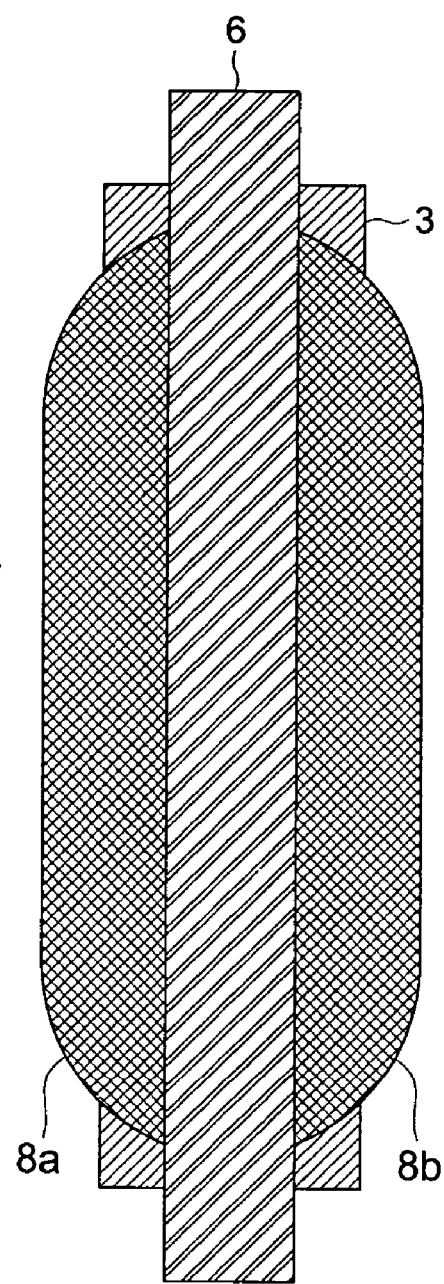

FIG. 7 - (1)
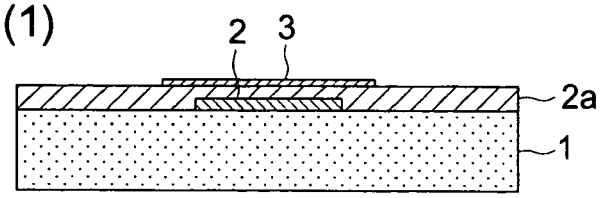
FIG. 7 - (2)
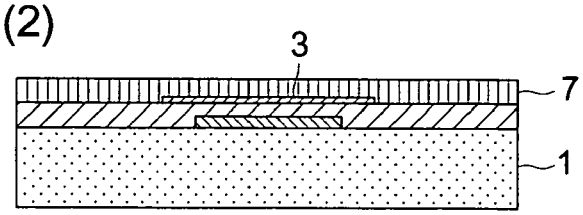
FIG. 7 - (3)
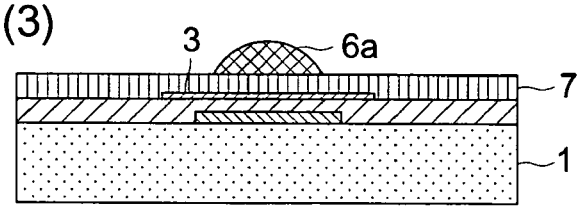
FIG. 7 - (4)
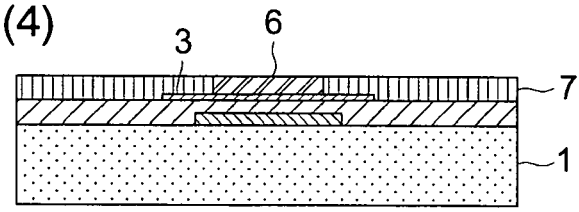
FIG. 7 - (5)
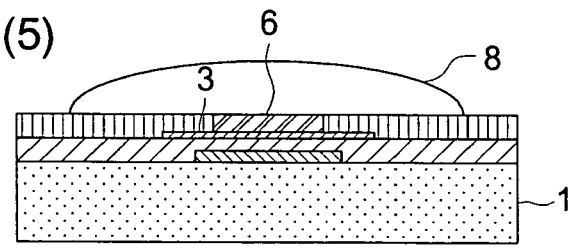
FIG. 7 - (6)
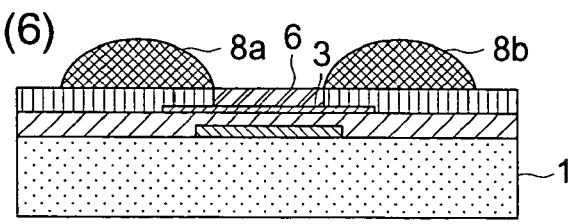
FIG. 7 - (7)
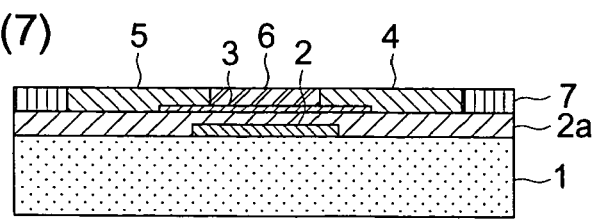

FIG. 8 - (1)
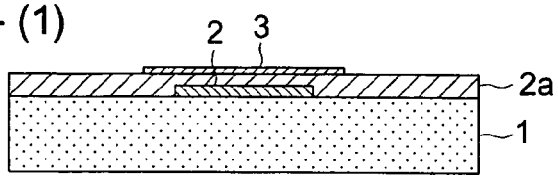
FIG. 8 - (2)
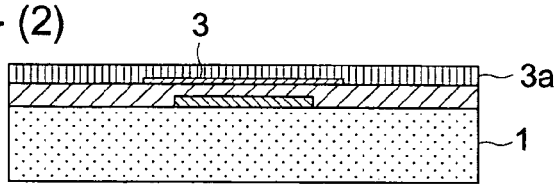
FIG. 8 - (3)
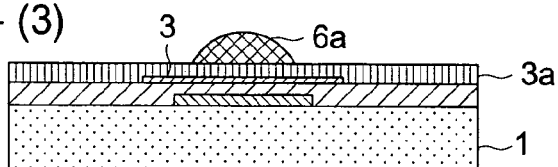
FIG. 8 - (4)
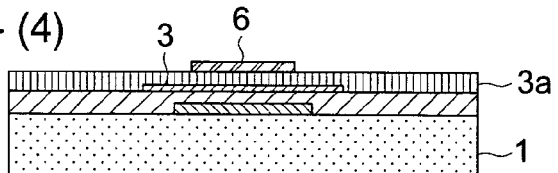
FIG. 8 - (5)
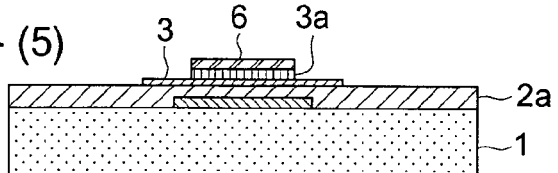
FIG. 8 - (6)
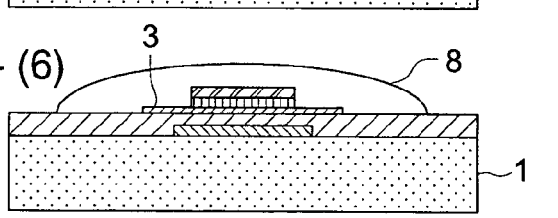
FIG. 8 - (7)
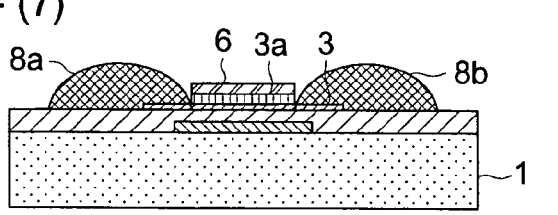
FIG. 8 - (8)
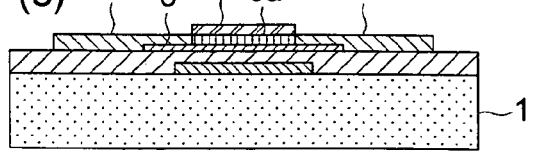

FIG. 15 - (1)
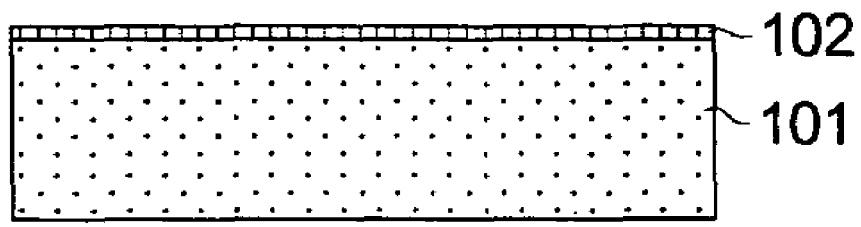
FIG. 15 - (2)
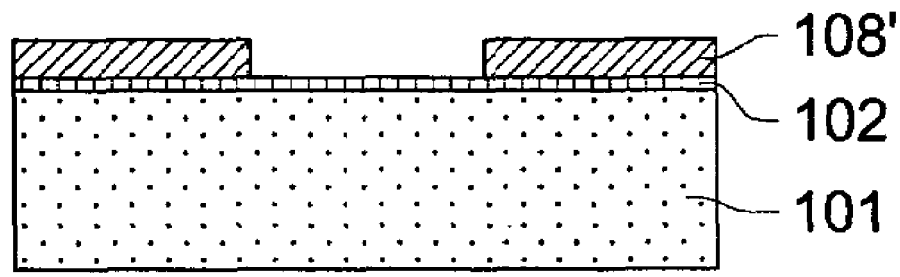
FIG. 15 - (3)
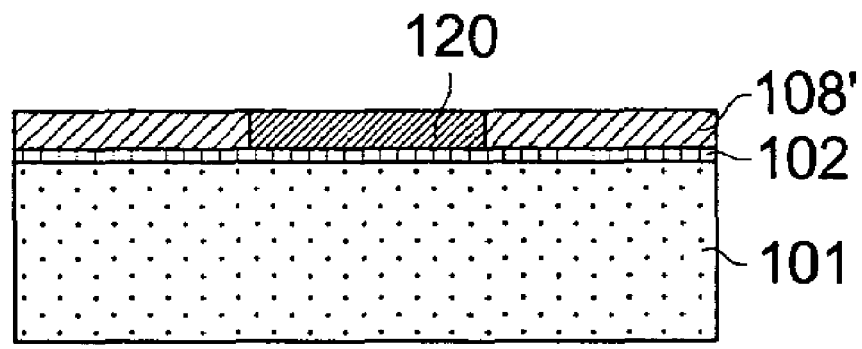

FIG. 16 - (1)
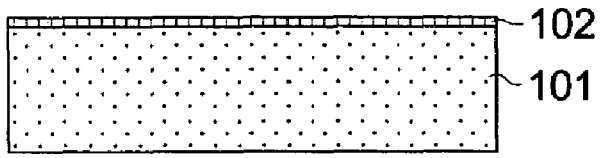
FIG. 16 - (2)
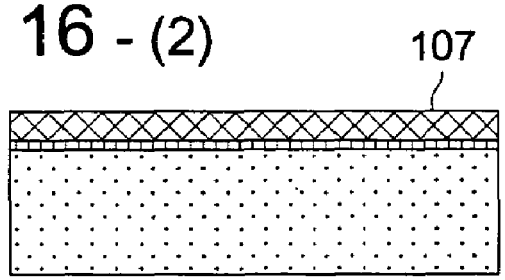
FIG. 16 - (3)
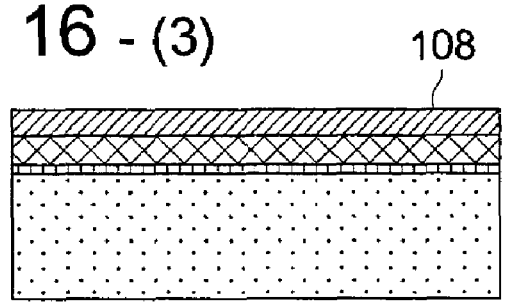
FIG. 16 - (4)
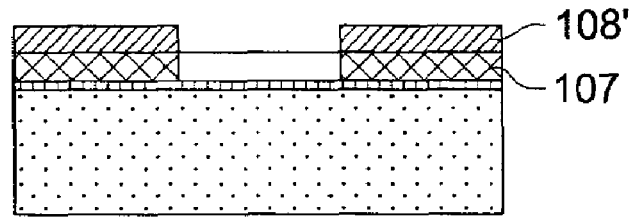
FIG. 16 - (5)
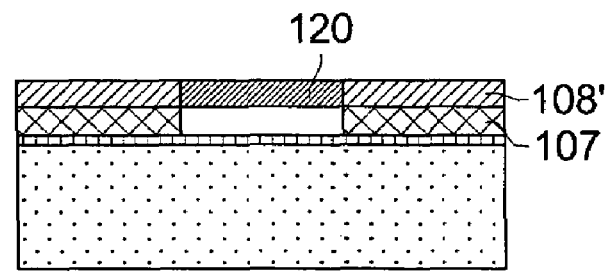

FIG. 17 - (1)
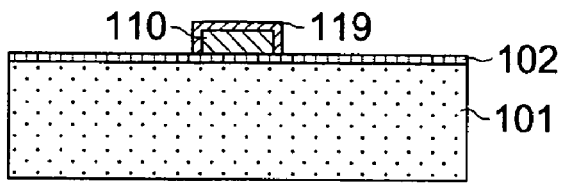
FIG. 17 - (2)
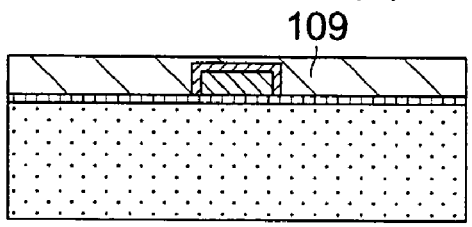
FIG. 17 - (3)
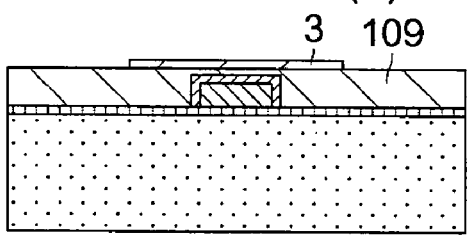
FIG. 17 - (4)
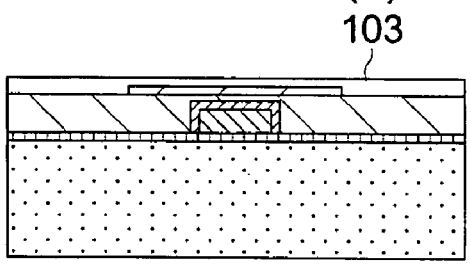
FIG. 17 - (5)
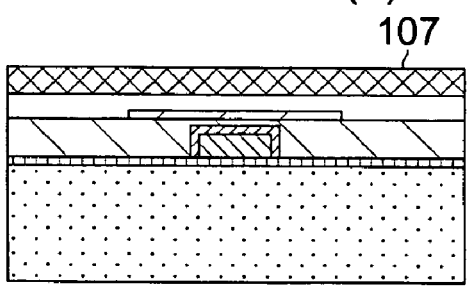
FIG. 17 - (6)
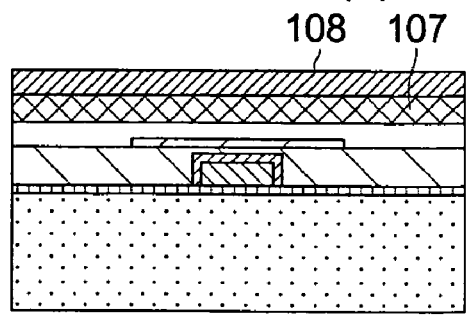
FIG. 17 - (7)
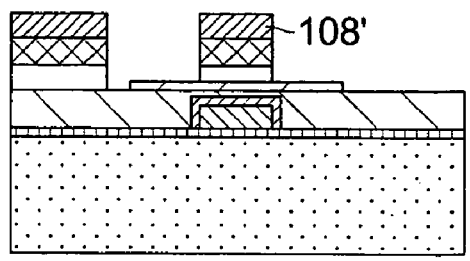
FIG. 17 - (8)
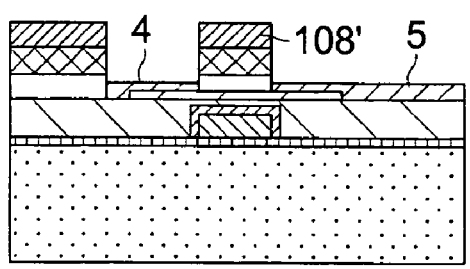

MANUFACTURING METHOD OF THIN-FILM TRANSISTOR, THIN-FILM TRANSISTOR SHEET, AND ELECTRIC CIRCUIT

FIELD OF THE INVENTION

The present invention relates to a method of a thin-film transistor, a thin-film transistor sheet, and an electric circuit.

BACKGROUND OF THE INVENTION

With the spread of information terminals, there are increasing demands for a flat panel display that serves as a display for a computer. Further, with development of the information technology, there has been increased a chance for information offered in a form of a sheet of paper medium in the past to be offered in an electronic form. An electronic paper or digital paper is demanded increasingly as a display medium for a mobile that is thin, lightweight and handy.

In the case of a display device of a flat sheet type, a display medium is generally formed using an element that employs a liquid crystal, organic EL or electrophoresis method. In the display medium of this kind, a technology for using an active driving element comprised of a thin-film transistor (TFT), serving as an image driving element, is the main current for ensuring uniform image brightness and an image rewriting speed.

The TFT is manufactured by a process comprising forming, on a glass substrate, a semiconductor layer of a-Si (amorphous silicone) or p-Si (poly-silicone) and metal films of source, drain and gate electrodes, in the order. In the manufacture of a flat panel display employing such a TFT, a photolithography step with high precision is required in addition to a thin layer forming step requiring a vacuum line carrying out a CVD method or a sputtering method or a high temperature treatment step, which results in great increase of manufacturing cost or running cost. Recent demand for a large-sized display panel further increases those costs described above.

In order to overcome the above-described defects, an organic thin-film transistor employing an organic semiconducting material has been extensively studied (see, for example, Japanese Patent O.P.I. Publication No. 10-190001 and "Advanced Material", 2002, No. 2, p. 99 (review)). Since the organic thin-film transistor can be manufactured at low temperature employing a lightweight substrate difficult to be broken, a flexible display employing a resin film as a substrate can be realized (see, for example, SID '02 Digest P. 57). Further, employing an organic semiconducting material allowing a wet process such as a printing method or a coating method, a display manufacturing process can be realized which provides excellent productivity and reduced cost.

A method is proposed (see, for example, WO 01/47043) in which an electrode in an organic thin-film transistor is formed employing an ink jet method, but this method employs a polyimide film formed according to photolithography at the organic semiconductor channel area between the source and drain electrodes.

These methods have problem in that the channel accuracy are poor, resulting in fluctuation of its performance of the resulting thin-film transistor. Further, as the methods described above have problem in that as SD electrodes are formed employing a liquid material, the electrodes are likely to be short-circuited which may make it impossible to manufacture a thin-film transistor.

SUMMARY OF THE INVENTION

The present invention has been made in view of the above. An object of the invention is to provide a method of easily and efficiently manufacturing a thin-film transistor, a thin-film transistor sheet and an electric circuit, each having high accuracy, without employing a vacuum system process requiring a large scale manufacturing facility. Another object of the invention is to provide a method of stably manufacturing a thin-film transistor a thin-film transistor sheet and an electric circuit, minimizing fluctuation of their performance.

BRIEF DESCRIPTION OF THE DRAWINGS

FIG. 1(*d*) shows a structural example of a top gate type thin-film transistor.

FIGS. 3(1), FIG. 3(2), FIG. 3(3), FIG. 3(4), FIG. 3(5), and FIG. 3(6) show one embodiment of the method of the invention of manufacturing a thin-film transistor.

FIG. 5(*b*) is an illustration in which an electrode material is separated into two by an insulating area to form an electrode on each side of the insulating area.

FIG. 6(*a*) is an illustration in which an electrode material is ejected on each side of an insulating area according to an ink jet method as ink droplet.

FIG. 6(*b*) is an illustration in which an electrode is formed on each side of an insulating area.

FIG. 7(1), FIG. 7(2), FIG. 7(3), FIG. 7(4), FIG. 7(5), FIG. 7(6), and FIG. 7(7) show another embodiment of the method of the invention of manufacturing a thin-film transistor.

FIG. 8(1), FIG. 8(2), FIG. 8(3), FIG. 8(4), FIG. 8(5), FIG. 8(6), FIG. 8(7), and FIG. 8(8) show further another embodiment of the method of the invention of manufacturing a thin-film transistor.

FIGS. 15(1), 15(2), and 15(3) show one embodiment of the method of the invention of manufacturing an electric circuit.

FIGS. 16(1), 16(2), 16(3), 16(4) and 16(5) show another embodiment of the method of the invention of manufacturing an electric circuit.

FIGS. 17(1), 17(2), 17(3), 17(4), 17(5), 17(6), 17(7), and 17(8) show another embodiment of the method of the invention of manufacturing a thin-film transistor.

DETAILED DESCRIPTION OF THE INVENTION

Figure 1:
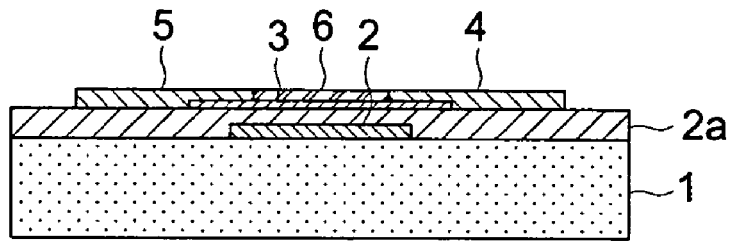
FIGS. 1(*a*), 1(*b*), and 1(*c*) each shows a structural example of a bottom gate type thin-film transistor.
Figure 1:
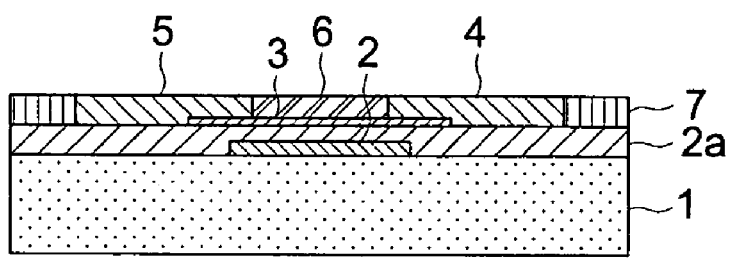
Figure 1:
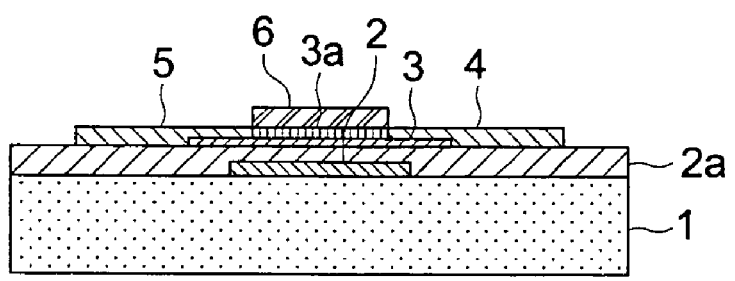
Figure 1:
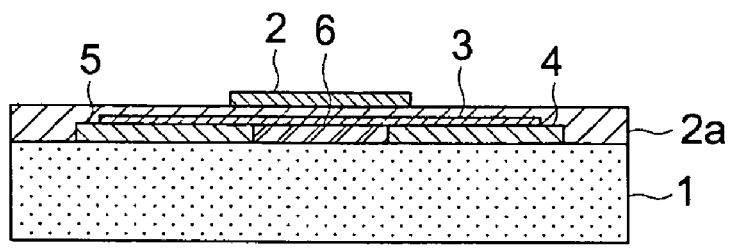

The above object of the invention can be attained by the following constitution:

1. A method of manufacturing a thin-film transistor comprising a substrate, and provided thereon, a gate electrode, a gate insulating layer, a semiconductor layer, a source electrode and a drain electrode, the method comprising the steps of:

a) forming the semiconductor layer by providing a semiconductive material on the substrate;

b) forming an insulating area, which is electrode material-repellent, by providing an electrode material-repellent material on the substrate; and c) forming a source electrode on one end of the insulating area and a drain electrode on the other end of the insulating area, by providing an electrode material.

2. The method of item 1 above, wherein the insulating area is comprised of a silicone rubber layer.

3. The method of item 1 above, wherein the thickness of the insulating area is from 0.05 to 10 μm.

4. The method of item 1 above, wherein the providing of the electrode material-repellent material is carried out by an ink jet method.

5. The method of item 1 above, further comprising the step of forming an ink receptive layer on the substrate before the formation of the insulating area, wherein the insulating area is formed in the ink receptive layer on the substrate.

6. The method of item 1 above, wherein the providing of the semiconductive material is carried out by an ink jet method.

7. The method of item 1 above, wherein the providing of the electrode material is carried out by an ink jet method.

8. The method of item 7 above, wherein the electrode material is contained in a solvent or a dispersion medium containing 50% by weight of water.

9. The method of item 1 above, wherein formation of the insulating area is carried out by providing a light sensitive layer on the substrate, providing an electrode material-repellent insulating layer on the light sensitive layer, exposing the resulting material and developing the exposed material.

10. The method of item 9 above, wherein the exposing is carried out employing laser.

11. The method of item 9 above, wherein the light sensitive layer is an ablation layer.

12. The method of item 1 above, wherein after the semiconductor layer has been formed, the insulating area is formed on the resulting semiconductor layer.

13. The method of item 1 above, wherein after the semiconductor layer has been formed, an ink receptive layer is provided on the resulting semiconductor layer, and then the insulating area is formed in the ink receptive layer on the semiconductor layer.

14. The method of item 1 above, wherein after the semiconductor layer has been formed, an intermediate layer is provided on the semiconductor layer so as to protect the resulting semiconductor layer, and then the insulating area is formed on the intermediate layer.

15. The method of item 1 above, wherein the semiconductor layer is an organic semiconductor layer containing an organic semiconductive material.

16. The method of item 1 above, wherein the substrate is a resin sheet comprised of a resin.

17. A method of manufacturing a thin-film transistor sheet comprising a gate busline, a drain busline, and a thin-film transistor comprising a substrate and provided thereon, a gate electrode, a gate insulating layer, a semiconductor layer, a source electrode and a drain electrode, the plural thin-film transistors being connected with each other through the gate busline and the source busline, the method comprising the steps of:

a) forming the semiconductor layer by providing a semiconductive material on the substrate;

b) forming an insulating area, which is electrode material-repellent, by providing an electrode material-repellent material on the substrate; and c) forming a source electrode on one end of the insulating area and a drain electrode on the other end of the insulating area by providing an electrode material.

18. The method of item 17 above, wherein the insulating area is comprised of a silicone rubber layer.

19. The method of item 17 above, wherein the thickness of the insulating area is from 0.05 to 10 μm.

20. The method of item 17 above, wherein the providing of the electrode material-repellent material is carried out by an ink jet method.

21. The method of item 17 above, further comprising the step of forming an ink receptive layer on the substrate before the formation of the insulating area, wherein the insulating area is formed in the ink receptive layer on the substrate.

22. The method of item 17 above, wherein the providing of the semiconductive material is carried out by an ink jet method.

23. The method of item 17 above, wherein the providing of the electrode material is carried out by an ink jet method.

24. The method of item 23 above, wherein the electrode material is contained in a solvent or a dispersion medium containing 50% by weight of water.

25. The method of item 17 above, wherein formation of the insulating area is carried out by providing a light sensitive layer on the substrate, providing an electrode material-repellent insulating layer on the light sensitive layer, exposing the resulting material and developing the exposed material.

26. The method of item 25 above, wherein the exposing is carried out employing laser.

27. The method of item 25 above, wherein the light sensitive layer is an ablation layer.

28. The method of item 17 above, wherein after the semiconductor layer has been formed, the insulating area is formed on the resulting semiconductor layer.

29. The method of item 17 above, wherein after the semiconductor layer has been formed, an ink receptive layer is provided on the resulting semiconductor layer, and then the insulating area is formed in the ink receptive layer on the semiconductor layer.

30. The method of item 17 above, wherein after the semiconductor layer has been formed, an intermediate layer is provided on the semiconductor layer so as to protect the resulting semiconductor layer, and then the insulating area is formed on the intermediate layer.

31. The method of item 17 above, wherein the semiconductor layer is an organic semiconductor layer containing an organic semiconductive material.

32. The method of item 17 above, wherein the substrate is a resin sheet comprised of a resin.

33. The method of item 17 above, wherein the semiconductor layer is formed so as to cross the gate busline.

34. The method of item 17 above, wherein the source electrode forms a pixel electrode or the source electrode is connected to a pixel electrode, wherein the pixel electrode is separated by the insulating area from the drain electrode which is connected to the source busline.

35. The method of item 17 above, wherein the substrate is transported during manufacture.

36. The method of item 17 above, wherein the substrate is transported in the direction crossing the gate busline to linearly form the insulating area.

37. A method of manufacturing an electric circuit comprising a substrate, and provided thereon, an electrode, the method comprising the steps of:

a) forming an insulating area, which is electrode material-repellent, by providing an electrode material-repellent material on the substrate; and b) forming an electrode by providing an electrode material on the substrate.

38. The method of item 37 above, wherein the insulating area is comprised of a silicone rubber layer.

39. The method of item 37 above, wherein the thickness of the insulating area is from 0.05 to 100 μm.

40. The method of item 37 above, wherein the providing of the electrode material-repellent material is carried out by an ink jet method.

41. The method of item 37 above, wherein the formation of the insulating area is carried out by providing an ink receptive layer on the substrate, and providing an electrode material-repellent material in the ink receptive layer.

42. The method of item 37 above, wherein the providing of the electrode material is carried out by an ink jet method.

43. The method of item 37 above, wherein the formation of the insulating area is carried out by providing a light sensitive layer on the substrate, providing an electrode material-repellent insulating layer on the light sensitive layer, exposing the resulting material and developing the exposed material.

44. The method of item 43 above, wherein the exposing is carried out employing laser.

45. The method of item 43 above, wherein the light sensitive layer is an ablation layer.

46. The method of item 37 above, wherein the substrate is a resin sheet comprised of a resin.

47. A thin-film transistor comprising a substrate, and provided thereon, a source electrode and a drain electrode each being comprised of an electrode material, an insulating area, which is electrode material-repellent, and a semiconductor layer, wherein each of the source electrode and the drain electrode is connected to the semiconductor layer and wherein the drain electrode is separated from the source electrode by the insulating area.

48. The thin-film transistor of item 47 above, wherein the insulating area is comprised of a silicone rubber layer.

49. The thin-film transistor of item 47 above, wherein the thickness of the insulating area is from 0.05 to 10 μm.

50. The thin-film transistor of item 47 above, further comprising a light sensitive layer.

51. A thin-film transistor comprising a substrate, and provided thereon, a gate electrode, a gate insulating layer, a semiconductor layer, and an insulating area, which is electrode material-repellent, in that order, wherein the thin-film transistor further comprises a drain electrode and a source electrode in which the drain electrode is separated from the source electrode by the insulating area.

52. The thin-film transistor of item 51 above, further comprising a light sensitive layer.

53. A thin-film transistor comprising two or more of the organic thin-film transistor of item 47 above.

54. A thin-film transistor sheet comprising two or more of the organic thin-film transistor of item 51 above.

55. A thin-film transistor sheet comprising an insulating area, which is electrode-repellent, a source busline, plural drain electrodes comprised of an electrode material, and plural source electrodes comprised of an electrode material, the source busline being connected to the plural drain electrodes, and each of the plural drain electrodes being connected to a respective pixel electrode, wherein the respective pixel electrode is separated from the source busline by the insulating area.

1-1. A thin-film transistor comprising a substrate, and provided thereon, a gate electrode, a semiconductor layer, a source electrode and a drain electrode, which is manufactured by the method comprising the steps of forming an insulating area, which is electrode material-repellent, and providing an electrode material on the insulating area side to form a source electrode on one end of the insulating area and a drain electrode on the other end of the insulating area.

1-2. The thin-film transistor of item 1-1 above, wherein the insulating area is comprised of a silicone rubber layer.

1-3. The thin-film transistor of item 1-1 or 1-2 above, wherein a receptive layer is provided on the substrate, and then an electrode material repellent material is supplied on the receptive layer to form the insulating area.

1-4. The thin-film transistor of any one of items 1-1 through 1-3 above, wherein an electrode material is supplied on the receptive layer to form the source electrode and the drain electrode.

1-5. The thin-film transistor of any one of items 1-1 through 1-4 above, wherein the insulating layer is formed on the semiconductor layer.

1-6. The thin-film transistor of any one of items 1-1 through 1-5 above, wherein an intermediate layer is provided between the semiconductor layer and the insulating area.

1-7. The thin-film transistor of any one of items 1-1 through 1-6 above, wherein the semiconductor layer contains an organic semiconductive material.

1-8. A method of manufacturing the thin-film transistor of any one of items 1-1 through 1-7 above, wherein the insulating area is formed employing an ink jet method.

1-9. A method of manufacturing the thin-film transistor of any one of items 1-1 through 1-7 above, wherein the source electrode and the drain electrode are formed employing an ink jet method.

1-10. A method of manufacturing the thin-film transistor of any one of items 1-1 through 1-7 above, wherein the insulating area, the source electrode and the drain electrode are formed employing an ink jet method.

1-11. The method of item 1-9 or 1-10 above, wherein a solvent or a dispersion medium of the ink used for formation of the insulating the source electrode and the drain electrode contains 50% by weight of water.

2-1. A method of manufacturing an electric circuit, the method comprising the steps of forming a light sensitive layer on a substrate, forming an electrode material-repellent insulating layer on the light sensitive layer, exposing the resulting material and developing the exposed material to form an electrode material-repellent area, and providing an electrode material on the electrode material-repellent area side to form an electrode.

2-2. The method of claim 2-1, wherein the exposure is carried out employing laser.

2-3. The method of claim 2-1 or 2-2, wherein the light sensitive layer is an ablation layer.

2-4. An electric circuit manufactured by the method of any one of items 2-1 through 2-3.

2-5. A method of manufacturing an organic thin-film transistor, the method comprising the steps of forming a gate electrode on a substrate, forming a gate insulating layer on the substrate, forming an organic semiconductor layer on the substrate, and forming a source electrode and a drain electrode on the substrate, wherein the formation of the source electrode and the drain electrode comprise the steps of forming a light sensitive layer, forming an electrode material-repellent insulating layer on the light sensitive layer, exposing the resulting material and developing the exposed material to form an electrode material-repellent area, and providing an electrode material on the electrode material-repellent area side.

2-6. The method of claim 2-5, wherein the exposure is carried out employing laser.

2-7. The method of claim 2-5 or 2-6, wherein the light sensitive layer is an ablation layer.

2-8. An organic thin-film transistor manufactured by the method of any one of items 2-5 through 2-7.

2-9. An organic thin-film transistor sheet comprising two or more of the organic thin-film transistor of item 2-8.

3-1. A method of manufacturing a thin-film transistor sheet comprising a gate busline, a drain busline, and a thin-film transistor comprising a substrate and provided thereon, a gate electrode, a gate insulating layer, a channel comprised of a semiconductor layer, a source electrode and a drain electrode, the plural thin-film transistors being connected with each other through the gate busline and the source busline, the method comprising the steps of forming an electrode material-repellent area, directly or through another layer, on the substrate or on the channel, and forming the source electrode and the drain electrode by providing an electrode material directly or through another layer, on the substrate or on the channel.

3-2. The method of item 3-1, wherein the channel crosses the gate busline.

3-3. The method of item 3-1 or 3-2, wherein the substrate is comprised of a resin plate.

3-4. The method of any one of items 3-1 through 3-3 above, wherein the electrode material is provided onto the electrode material-repellent area, the electrode material being separated by the electrode material-repellent area to form a source electrode on one end of the electrode material-repellent area and a drain electrode on the other end of the electrode material-repellent area.

3-5. The method of any one of items 3-1 through 3-4 above, wherein the source electrode forms a pixel electrode or is connected to a pixel electrode, and the pixel electrode is separated by the electrode material-repellent area from the drain electrode which is connected to the source busline.

3-6. The method of any one of items 3-1 through 3-5 above, wherein the electrode material is provided by an ink jet method.

3-7. The method of any one of items 3-1 through 3-6 above, wherein the electrode material is provided on the entire surface of the electrode material-repellent area side.

3-8. The method of any one of items 3-1 through 3-7 above, wherein the semiconductor layer contains an organic semiconductor material.

3-9. The method of any one of items 3-1 through 3-8 above, wherein the semiconductor layer is formed by an ink jet method.

3-10. The method of any one of items 3-1 through 3-9 above, wherein the substrate is transported during manufacture.

3-11. The method of any one of items 3-1 through 3-10 above, wherein the substrate is transported in the direction crossing the gate busline, and the electrode material-repellent area is linearly formed.

3-12. A thin-film transistor sheet manufactured according to the method of any one of items 3-1 through 3-11 above.

The present invention will be explained below.

The method of the invention is a method of manufacturing a thin-film transistor comprising a substrate, and provided thereon, a gate electrode, a gate insulating layer, a channel comprised of a semiconductor layer, a source electrode and a drain electrode, the method comprising the steps of a) forming the channel by providing a semiconductive material on the substrate, b) forming an insulating area, which is electrode material-repellent, by providing an electrode material-repellent material on the substrate, and c) forming a source electrode on one end of the insulating area and a drain electrode on the other end of the insulating area, by providing an electrode material on the side of the insulating area.

The structure of the thin-film transistor (hereinafter also referred to as organic thin-film transistor) and the thin-film transistor sheet (hereinafter also referred to as organic thin-film transistor sheet) in the invention will be explained below, employing FIGS. 1(a) through 1(d) and FIG. 2.

As the organic thin-film transistor in the invention, there are a top gate type organic thin-film transistor, and a bottom gate type organic thin-film transistor. The bottom gate type organic thin-film transistor comprises a substrate, a gate electrode directly or another layer such as a subbing layer provided on the substrate, a gate insulating layer provided on the substrate, and a source electrode and a drain electrode connected through an organic semiconductor layer on the gate insulating layer. The top gate type organic thin-film transistor comprises a substrate, a source electrode and a drain electrode connected through an organic semiconductor layer provided on the substrate, a gate insulating layer provided thereon, and a gate electrode provided on the gate insulating layer.

The structural examples thereof will be shown in FIGS. 1(a) through 1(d).

FIGS. 1(a) through 1(c) each are structural examples of the bottom gate type organic thin-film transistor.

In FIG. 1(a), a gate electrode 2 is provided on a substrate 1, a gate insulating layer 2a is provided on the gate electrode 2, an organic semiconductor layer 3 provided on the gate insulating layer 2a, an insulating area 6, which is capable of repelling an electrode material, on the organic semiconductor layer 3, and a source electrode 5 on one side of the insulating area 6 and a drain electrode 4 on the other side of the insulating area 6.

Although not illustrated in FIG. 1(a), a subbing layer may be provided between the substrate 1 and the gate electrode 2, and the gate electrode 2 may be anodized to form an oxidized film on the surface.

In FIG. 1(b), a layer 7 (for example, an ink receptive layer) is provided on the organic semiconductor layer 3, and the insulating area 6, which is capable of repelling an electrode material, the source electrode 5 on one side of the insulating area 6 and the drain electrode 4 on the other side of the insulating area 6 are provided in the layer 7.

FIG. 1(c) is the same as FIG. 1(a), except that an organic semiconductor layer protective layer (hereinafter also referred to as intermediate layer) 3a is provided between the organic semiconductor layer 3 and the insulating area 6. Herein, the organic semiconductor layer protective layer is provided in order to minimize a chemical or physical influence of a material constituting the insulating area 6 upon the organic semiconductor layer.

FIG. 1(d) is a structural example of the top gate type organic thin-film transistor.

In FIG. 1(d), an insulating area 6 is provided on a substrate 1, a source electrode 5 on one side of the insulating area 6, a drain electrode 4 on the other side of the insulating area 6, an organic semiconductor layer 3 provided so as to connect the source electrode 5 and the drain electrode 4, a gate insulating layer 2a is provided on the organic semiconductor layer 3, and a gate electrode 2 is provided on the gate insulating layer 2a.

Figure 2:
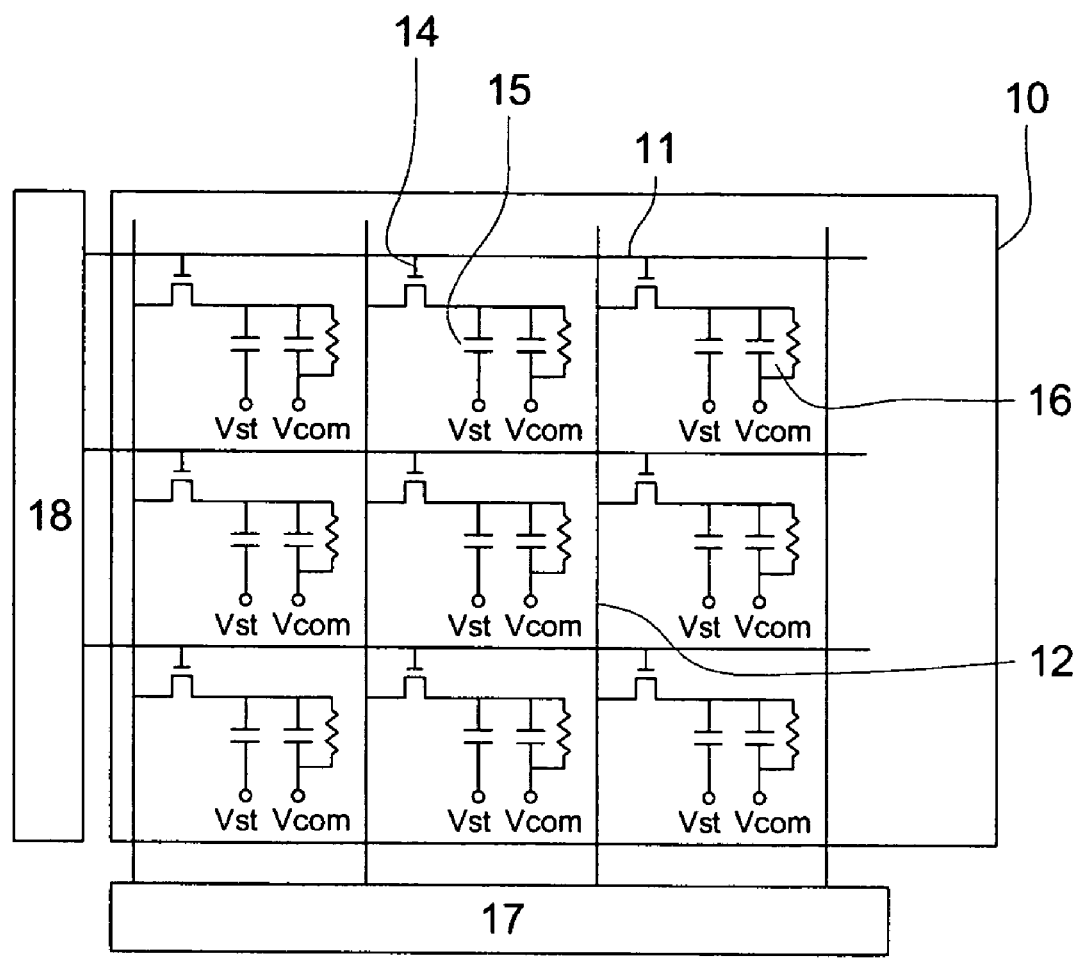
FIG. 2 shows an equivalent circuit diagram of one embodiment of a thin-film transistor sheet, in which plural thin-film transistors are arranged.

FIG. 2 shows an equivalent circuit diagram of one embodiment of the thin-film transistor sheet, in which plural thin-film transistors in the invention are arranged.

The thin-film transistor sheet 10 comprises many thin-film transistors 14 arranged in a matrix form. Numerical number 11 is a gate busline of the gate electrode of each of the thin-film transistors 14, and numerical number 12 a source busline of the source electrode of each of the thin-film transistors 14. Output element 16 is connected to the drain electrode of each of the organic thin-film transistors 14. The output element 16 is for example, a liquid crystal or an electrophoresis element, which constitutes pixels in a display. In FIG. 2, liquid crystal as the output element 16 is shown in an equivalent circuit diagram comprised of a capacitor and a resistor. Numerical number 15 shows a storage capacitor, numerical number 17 a vertical drive circuit, and numerical number 18 a horizontal drive circuit.

The present invention can provide an organic thin-film transistor sheet, in which thin-film transistors are arranged two-dimensionally on a flexible resin, having strong adhesion between the substrate and the TFT constitution layer, excellent mechanical strength, and strong resistance to folding of the substrate.

The present invention is a thin-film transistor comprising a substrate, and provided thereon, a gate electrode, a gate insulating layer, a semiconductor layer, a source electrode and a drain electrode, and a manufacturing method thereof comprising the steps of a) forming the semiconductor layer by providing a semiconductive material on the substrate, b) forming an insulating area, which is electrode material-repellent, by providing an electrode material-repellent material on the substrate, and c) forming a source electrode on one end of the insulating area and a drain electrode on the other end of the insulating area, by providing an electrode material.

Next, layers or areas contained in the organic thin-film transistor of the invention will be explained.

<<Insulating Area Having an Electrode Material-repellent Ability>>

The insulating area in the invention having an electrode material-repellent ability (hereinafter also referred to simply as the insulating area in the invention) will be explained below.

In the invention, the insulating area is an area having an ability, which repels a material for an electrode (typically, a drain electrode or a source electrode). When a thin-film transistor is a bottom gate type, the insulating area is formed on an organic semiconductor layer, and when an¥ thin-film transistor is a top gate type, the insulating area is formed directly or another layer (for example, a subbing layer) on a substrate.

In the invention, the insulating area is preferably formed according to a wet process such as a printing method or an ink jet method, in that influence on an organic semiconductor layer (described later) is minimized. The ink jet method is more preferred.

As the ink jet method, a known ink jet method such as a piezo method can be used, but a static suction method is preferably used in that a precise pattern can be formed.

When the insulating area is formed by ejecting ink according to the ink jet method, ink is preferably ejected on an ink receptive layer (described later) in that the insulating area can be adjusted to an appropriate size by the ink receptive layer. The ejected ink is absorbed in the ink receptive layer, and dried or hardened, which can prevent the ink from spreading.

As the ink receptive layer, a void type ink receptive layer (described later) used in a conventional ink jet recording medium is preferably used.

The insulating area (electrode material-repellent layer) used in the invention may be any, as long as it is a layer having an electrode material repellent ability. Such an electrode material-repellent layer may be comprised of a layer containing an adhesive such as a silane coupling agent, a titanate coupling agent or a silicone polymer, or may be comprised of a layer containing a phenol resin or an epoxy resin, when an electrode material liquid employing a solvent containing water as a main component is used. Ink repellent layers used in a waterless planographic printing plate material as disclosed in Japanese Patent O.P.I. Publication Nos. 2002-131894 and 2002-26826 can be used as the electrode material-repellent layer in the invention. Among these, the insulating area is preferably comprised of a silicone rubber layer.

The silicone rubber layer usable in the invention may be optionally selected from known ones such as those disclosed in Japanese Patent O.P.I. Publication No. 7-164773. A condensation cross-linking type silicone rubber layer in which a condensation cross-linking type silicone rubber silicone rubber composition is hardened by a condensation reaction, and an addition cross-linking type silicone rubber layer in which an addition cross-linking type silicone rubber composition is hardened by an addition reaction, are preferably used.

The condensation cross-linking type silicone rubber composition contains, as essential components, a linear organopolysiloxane having a hydroxyl group at each of the both terminals and a reactive silane compound capable of forming a silicone rubber layer by cross-linking with the linear organopolysiloxane.

The condensation cross-linking type silicone rubber composition to be used in the invention is hardened by the condensation reaction in the presence of an optional condensation catalyst such as an organic carboxylic acid, a titanate ester, a stannous ester, an aluminum organic ester and a platinum catalyst for raising the reaction efficiency of the reactive silane compound with the linear organopolysiloxane having a hydroxyl group at each of the both terminals.

In the invention, the ratio of the linear organopolysiloxane having a hydroxyl group at each of the both terminals, the reactive silane compound and the condensation catalyst in the silicone rubber layer is 80 to 98%, preferably from 85 to 98%, by weight of the linear organopolysiloxane having a hydroxyl group at each of the both terminals, usually from 2 to 20%, preferably from 2 to 15%, more preferably from 2 to 7%, by weight of the reactive silane compound and from 0.05 to 5%, preferably from 0.1 to 3, more preferably from 0.1 to 1%, by weight.

In the silicone rubber layer to be used in the invention, a polysiloxane compound other than the linear organopolysiloxane having a hydroxyl group at each of the both terminals may be added in a ratio of from 2 to 15%, preferably 3 to 12%, by weight of the whole weight of the solid components of the silicone rubber layer. Examples of such the siloxane compound include polydimethylsiloxane having a trimethylsilyl group at each of the both terminals and a Mw of from 10,000 to 1,000,000.

The addition cross-linking type silicone rubber composition contains, as the essential components, an organopolysiloxane compound having at least two aliphatic unsaturated groups in the molecular thereof and an organopolysiloxane compound having at least two Si—H bonds in the molecular thereof which is cross-linked with the organopolysiloxane compound having at least two aliphatic unsaturated groups in the molecular thereof to form the silicone rubber layer.

The organopolysiloxane compound having at least two aliphatic unsaturated groups in the molecular thereof may have any structure of linear, cyclic or branched, and ones having the linear structure are preferred. Examples of the aliphatic unsaturated group include an alkenyl group such as a vinyl group, an aryl group, a butenyl group, a pentenyl group, a hexenyl group; a cycloalkenyl group such as a cyclopentenyl group, a cyclohexenyl group, a cycloheptenyl group and a cyclooctenyl group, and an alkynyl group such as an ethynyl group, a propynyl group, a butynyl group, a pentynyl group and a hexynyl group. Among them, an alkenyl group having an unsaturated bond at the terminal is preferable from the viewpoint of the reactivity, and a vinyl group is particularly preferable. The substituent other than the aliphatic unsaturated group is preferably a methyl group.

Mw of the organopolysiloxane having at least two aliphatic unsaturated groups in the molecule thereof is usually from 500 to 500,000, preferably from 1,000 to 3,000,000.

The organopolysiloxane compound having at least two Si—H bonds in the molecular thereof may have any structure of linear, cyclic or branched, and ones having the linear structure is preferred. The Si—H bond may be existed at either the terminal or intermediate portion of the siloxane skeleton, and the ratio of the hydrogen atom to the total number of the substituent is usually from 1 to 60%, preferably from 2 to 50%. The substituent other than the hydrogen atom is preferably a methyl group. The Mw of the organopolysiloxane compound having at least two Si—H bonds in the molecular thereof is usually from 300 to 300,000, preferably from 500 to 200,000. The Mw too high tends to cause lowering in the sensitivity and in the image reproducibility.

An addition reaction catalyst is usually used to occur the addition reaction of the organopolysiloxane compound having at least two aliphatic unsaturated groups in the molecular thereof with the organopolysiloxane compound having at least two Si—H bonds in the molecular thereof. The addition reaction catalyst can be optionally selected from known ones, and a platinum catalyst is preferably used. One or a mixture selected from metals of platinum group and compounds of metal of platinum group may be preferably used as the addition reaction catalyst. Examples of the metal of platinum group include elemental platinum such as platinum black, elemental palladium such as palladium black and elemental rhodium. Examples of the compound of metal of platinum group include chloroplatinic acid, a platino-olefin complex, a platino-alcohol complex, a platino-ketone complex, a complex of platinum and vinylsiloxane, platinum tetrakis(triphenyl-phosphine) and palladium tetrakis (triphenylphosphine). Among them, chloroplatinic acid or platino-olefin complex dissolved in an alcoholic solvent, an ether solvent or a carbon hydride solvent is particularly preferred.

In the above-mentioned silicone rubber layer, the content of the organopolysiloxane having at least two aliphatic unsaturated groups in the molecule is 80 to 98%, and preferably from 85 to 98%, the content of the organosiloxane having at least two Si—H bonds in the molecular is usually from 2 to 20%, and preferably from 2 to 15% by weight, and the content of the addition reaction catalyst is from 0.0001 to 10%, and preferably from 0.0001 to 5% by weight.

An amino-containing organic silicon compound having a hydrolyzable group represented by formula (VII) disclosed in Japanese Patent O.P.I. Publication Nos. 10-244773 may be added to the addition cross-linking type silicone rubber layer.

The content of the amino-containing organic silicon compound in the silicone rubber layer is from 0 to 10%, and preferably from 0 to 5% by weight. A hardening delaying agent may be added into the addition cross-linking silicone rubber layer. The hardening delaying agent can be optionally selected from compounds known as the hardening delaying agent such as an acetylene alcohol, a maleic ester, a silylated compound of acetylene alcohol, a silylated compound of maleic acid, a triacyl isocyanulate and a vinylsiloxane.

The adding amount of the hardening delaying agent is usually from 0.0001 to 1.0 parts by weight of the whole solid components of the silicone rubber layer, even though the amount may be different according to the desired hardening speed.

In the invention, the insulating area is preferably formed according to the printing method, preferably a n ink jet method described above, employing a solution in which the silicone rubber composition described above is dissolved in a suitable solvent. Examples of the solvent include n-hexane, cyclohexane, petroleum ether, and aliphatic carbon hydride solvents Isopar E, H and G, manufactured by Exxon Co., Ltd., and a mixture of the foregoing solvents with a ketone such as methyl ethyl ketone and cyclohexanone, an ester such as butyl acetate, amyl acetate and ethyl propionate, a carbon hydride or a halogenated carbon hydride such as toluene, xylene, monochlorobenzene, carbon tetrachloride, trichloroethylene and trichloroethane, an ether such as methyl cellosolve, ethyl cellosolve and tetrahydrofuran, and polypropylene glycol monomethyl ether acetate, pentoxon or dimethylformamide.

A super water-repellent material disclosed in "SCIENCE", Vol. 299, 1377 can be also used.

The insulating area has a light transmittance of preferably not more than 10%. This can prevent deterioration due to light of the organic semiconductor layer.

In the invention, light transmittance shows an average light transmittance of light having a wavelength capable of generating a light generating carrier in the organic semiconductor layer. Generally, a light with a wavelength from 350 to 750 nm is preferably shielded.

In the invention, arrival of light at the organic semiconductor layer should be prevented in order to minimize deterioration due to light of the organic semiconductor layer. Accordingly, light transmittance may be reduced not only by the insulating area but also by an intermediate layer, an ink receptive layer or another layer, which may be provided on the organic semiconductor layer (all layers in the case of multi-layers) to give a light transmittance of not more than 10%, and preferably not more than 1%.

In order to reduce light transmittance of the layer, the layer can contain colorants such as pigments and dyes, or UV absorbing agents.

In the invention, the thickness of the insulating area of the thin-film transistor or the thin-film transistor is preferably from 0.05 to 10 μm, and more preferably from 0.5 to 2 μm <<Electrode Material: Material for a Source Electrode or Drain Electrode>>

The method of the invention comprises providing an electrode material as described later on the insulating area side, wherein the insulating area separates the provided electrode material to form a source layer on one end of the insulating area and a drain electrode on the other end of the insulating area.

The electrode materials for constituting a gate electrode or a source electrode are not particularly restricted as long as they are electrically conductive materials. Employed as the materials are platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. As materials for the above electrodes, electrically conductive polymers known in the art, which increase electrical conductivity upon being doped, are preferably employed. Examples thereof include electrically conductive polyaniline, electrically conductive polypyrrole, electrically conductive polythiophene, and a complex of polyethylenedioxythiophene and polystyrene sulfonic acid. The source and drain electrodes are those providing less electrical resistance at an interface between the electrodes and the semiconductor layer, and are preferably electrodes comprised of a conductive polymer, platinum, gold, silver, or ITO in p-type semiconductor.

In the invention, the source electrode and drain electrode are preferably electrodes formed from a flowable electrode material such as a solution, paste, ink, or a dispersion solution containing the above electrically conductive material, and more preferably electrodes formed from a flowable electrode material containing a conductive polymer, platinum, gold, silver, or copper. As a solvent or a dispersion medium, a solvent or dispersion medium containing water in an amount of not less than 60%, and more preferably not less than 90% is preferred in that damage to the organic semiconductor is reduced.

As a metal particle-containing flowable electrode material, a known conductive paste can be used. The metal particle-containing dispersion is preferably a dispersion in which metal particles with a particle size of from 1 to 50 nm, and preferably from 1 to 10 nm, and optionally a dispersion stabilizer are dispersed in water or an appropriate solvent.

Materials for the metal particles include platinum, gold, silver, nickel, chromium, copper, iron, tin, antimony, lead, tantalum, indium, palladium, tellurium, rhenium, iridium, aluminum, ruthenium, germanium, molybdenum, tungsten, and zinc.

The electrode is preferably formed from a metal particle dispersion in which metal particles of these metals are dispersed in a dispersion medium such as water or an organic solvent in the presence of an organic dispersion stabilizer Methods for preparing such a metal particle dispersion include a physical preparation method such as a gas vaporization method, a sputtering method, or a metallic vapor preparation method and a chemical preparation method such as a colloid method or a co-precipitation method in which metal ions are reduced in a liquid phase to produce metal particles. The metal particles dispersion are preferably ones prepared according to a colloid method disclosed in Japanese Patent O.P.I. Publication Nos. 11-76800, 11-80647, 11-319538, and 2000-239853, or ones prepared according to a gas vaporization method disclosed in Japanese Patent O.P.I. Publication Nos. 2001-254185, 2001-53028, 2001-35814, 2001-35255, 2001-124157 and 2000-123634. An electrode pattern is formed from these metal particle dispersions dried, and optionally subjected to heat treatment at from 100 to 300° C., and preferably from 150 to 200° C., whereby the metal particles are heat-fused to form an electrode in an intended form.

Methods for forming the electrode include a method in which a photolithographic method or a lift-off method, known in the art, is applied to an electrically conductive layer of the materials described above, which has been formed employing a vacuum deposition method or a sputtering method, and a method in which a resist layer is subjected to etching which has been prepared employing thermal transfer or ink jet printing onto a foil of metal such as aluminum or copper. Further, an electrically conductive polymer solution or dispersion, or a minute electrically conductive particle dispersion may be subjected directly to patterning, employing ink jet printing to obtain an electrode. An electrode may also be formed in such a manner that a coated layer is subjected to lithography or laser ablation. In addition, a method may also be employed in which ink comprising either an electrically conductive polymer or minute electrically conductive particles, or electrically conductive paste is subjected to patterning, employing any of the printing methods such as letter press, intaglio printing, lithography, or screen printing.

In the invention, a method of providing an electrode material on the insulating area having an electrode material-repellent property in order to form a source or drain electrode may be any as long as it can form the source or drain electrode.

When the source electrode and drain electrode are formed by ejecting ink containing the electrode material on the insulating area according to the ink jet method, an ink receptive layer is preferably provided in that the electrode formation area can be adjusted to an appropriate size by the ink receptive layer. As the ink receptive layer, a void-containing ink receptive layer used in a conventional ink jet recording medium is preferably used.

The ink receptive layer will be explained below.

<<Ink Receptive Layer>>

The method of the invention comprises providing an electrode material-repellent material on a substrate to form an insulating area, and providing an electrode material on the insulating area side to form a first electrode on one end of the insulating area and a second electrode on the other end of the insulating area. Herein, it is preferred that the electrode material-repellent material and/or the electrode material is preferably provided as solution or dispersion onto the ink receptive layer above according to an ink jet method.

The ink receptive layer is preferably a void-containing ink receptive layer (hereinafter also referred to simply as void-containing layer). The void-containing layer is obtained by coating of a composition containing a water soluble polymer and fine particles.

Listed as fine particles usable for the void-containing ink receptive layer are inorganic particles or organic particles. Inorganic particles are preferred, since fine particles are easily obtained. Examples of the inorganic particles include white inorganic pigments such as, for example, precipitated calcium carbonate, heavy calcium carbonate, magnesium carbonate, kaolin, clay, talc, calcium sulfate, barium sulfate, titanium dioxide, zinc oxide, zinc hydroxide, zinc sulfide, zinc carbonate, hydrotalcite, aluminum silicate, diatomaceous earth, calcium silicate, magnesium silicate, synthetic non-crystalline silica, colloidal silica, alumina, colloidal alumina, false boehmite, aluminum hydroxide, lithopone, zeolite, magnesium hydroxide, and the like. The particles may exist in the void-containing layer in the form of primary particles, or aggregated secondary particles.

The inorganic particles are preferably alumina, false boehmite, colloidal silica, or silica particles synthesized by a gas phase method, and more preferably silica particles synthesized by a gas phase method. The silica particles synthesized by a gas phase method may be those surface-treated with Al. The Al content of the silica particles surface-treated with Al is from 0.05 to 5% by weight based on the silica.

The particle size of the particles may be any, but is preferably not more than 1 μm, more preferably not more than 0.2 μm, and most preferably not more than 0.1 μm. Herein, the lower limit of the particle size is not specifically limited, but is preferably, more preferably not less than 0.003 μm, and more preferably not less than 0.005 μm, in view of manufacture of the particles.

The average particle size of the particles described above is determined in such a manner that particles located at the cross-section or the surface of the void-containing layer are observed employing an electron microscope, the size of randomly selected 100 particles are determined, and the simple average (arithmetic average) is computed. The particle size of the individual particle is expressed in terms of a diameter of a circle having the same area as the projected area of the particle.

The particles may exist in the void-containing layer in the form of primary particles, secondary particles or higher order particles. The particles used for the calculation of the average particle size are those independently existing in the porous layer.

The particle content of the aqueous coating solution is preferably from 5 to 40% by weight, and more preferably from 7 to 30% by weight.

The water soluble binder contained in the ink receptive layer with voids is not specifically limited, and may be any known water soluble binder. Examples of the water soluble binder include gelatin, polyvinyl pyrrolidone, polyethylene oxide, polyacryl amide and polyvinyl alcohol. Polyvinyl alcohol is especially preferred.

Polyvinyl alcohol interacts with the inorganic particles, exhibits strong retention property to the inorganic particles, and is relatively low in humidity dependency of hygroscopic property. The polyvinyl alcohols preferably used in the invention include an ordinary polyvinyl alcohol obtained by hydrolyzing polyvinyl acetate, and a modified polyvinyl alcohol such as a cation-modified polyvinyl alcohol or an anion-modified polyvinyl alcohol.

The polyvinyl alcohol obtained by hydrolyzing polyvinyl acetate has an average polymerization degree of preferably not less than 300, and more preferably 1000 to 5,000. The polyvinyl alcohol has a saponification degree of preferably 70 to 100 mol %, and more preferably 80 to 99.5 mol %.

The cation-modified polyvinyl alcohol is a polyvinyl alcohol having a primary to tertiary amino group or a quaternary ammonium group in its main or side chain, and is obtained by saponifying a copolymer of vinyl acetate and an ethylenically unsaturated monomer having a cationic group.

Examples of the ethylenically unsaturated monomer having a cationic group include trimethyl-(2-acrylamide-2,2-dimethylethyl)ammonium chloride, trimethyl-(3-acrylamide-3,3-dimethylpropyl)ammonium chloride, N-vinylimidazole, N-vinyl-2-methylimidazole, N-(3-dimethylaminopropyl)methacrylamide, hydroxyethyltrimethylammonium chloride, trimethyl-(3-methacrylamidopropyl)ammonium chloride, and N-(1,1-dimethyl-3-dimethylaminopropyl)acrylamide.

The content of the monomer having a cationic group in the cation-modified polyvinyl alcohol is preferably 0.1 to 10 mol %, more preferably 0.2 to 5 mol %, based on the vinyl acetate content.

Examples of the anion-modified polyvinyl alcohol include polyvinyl alcohol having an anionic group disclosed in Japanese Patent O.P.I. Publication No. 1-206088, a copolymer of vinyl alcohol and a vinyl compound having a water-solubilizing group disclosed in Japanese Patent O.P.I. Publication Nos. 61-237681 and 63-307979, and a modified polyvinyl alcohol having a water-solubilizing group disclosed in Japanese Patent O.P.I. Publication Nos. 7-285265.

Examples of the nonion-modified polyvinyl alcohol include a polyvinyl alcohol derivative prepared by the addition of polyethylene oxide to a part of hydroxy groups of polyvinyl alcohol disclosed in Japanese Patent O.P.I. Publication No. 7-9758, and a block copolymer of a vinyl compound having a hydrophobic group and vinyl alcohol disclosed in Japanese Patent O.P.I. Publication No. 8-25795.

Polyvinyl alcohols can be used as a mixture of two or more thereof, according to the polymerization degree and kinds of modification. When polyvinyl alcohol with a polymerization degree of not less than 2000, polyvinyl alcohol with a polymerization degree of not more than 1000 is in advance added in an amount of 0.05 to 10% by weight, and preferably 0.1 to 5% by weight based on the inorganic particle weight to an inorganic particle dispersion, and then the polyvinyl alcohol with a polymerization degree of not more than 1000 is added, which exhibits no marked viscosity increase.

The content ratio of the particles to the hydrophilic polymer in the void-containing ink receptive layer is preferably 2 to 20 by weight, more preferably 2.5 to 12, and still more preferably 3 to 10. This ratio in the void-containing layer maintains a proper void ratio and sufficient void volume, prevents an excessive hydrophilic binder from swelling and clogging the voids during ink ejection, maintains a proper ink absorption speed, and prevents cracks from occurring in the void-containing layer. the exposed material to form an insulating area.

In the invention, the formation of the insulating area is also carried out by providing a light sensitive layer on the substrate, providing an electrode material-repellent insulating layer on the light sensitive layer, exposing the resulting material and developing the exposed material to form an insulating area. The light sensitive layer is preferably an ablation layer.

In the invention, the ablation layer refers to a layer to be ablated by irradiation of a high density energy light. Adhesion between the ablation layer and the electrode material repellent layer varies due to by irradiation of a high density energy light. Herein, "ablated" refers to phenomenon in which an ablation layer is completely scattered or a part of the layer is destroyed and/or scattered by its physical or chemical change, or the physical or chemical change occurs only near the interface between the layer and its adjacent layer. In the invention, a resist can be formed employing this phenomenon, and then the insulating area is formed and then electrodes can be formed.

An ablation layer used in the invention contains an actinic light absorbing agent, a binder resin, and optionally various additives.

As the actinic light absorbing agent, there are various organic or inorganic materials capable of absorbing actinic light. For example, when infrared laser is used as actinic light, pigment absorbing infrared light, dyes, metals, metal oxides, metal nitrides, metal carbonates, metal borides, graphite, carbon black, titanium black, and ferromagnetic metal powder such as metal magnetic powder containing Al, Fe, Ni, or Co as a main component can be used. Among these, carbon black, dyes such as cyanine dyes and Fe containing ferromagnetic metal powder are preferred. The content of the actinic light absorbing agent in the ablation layer is from 30 to 95% by weight, and preferably from 40 to 80% by weight.

The binder resin used in the invention may be any resin as long as it can carry the actinic light absorbing agent described above. Examples of the binder resin include a polyurethane resin, a polyester resin, a vinyl chloride resin, a polyvinyl acetal resin, a cellulose resin, an acryl resin, a phenoxy resin, a polycarbonate resin, a polyamide resin, a phenol resin, and an epoxy resin. The content of the binder resin in the ablation layer is from 5 to 70% by weight, and preferably from 20 to 60% by weight.

The high density energy light can be used without any special limitation as long as it is light capable of ablating an ablation layer on exposure. As an exposure method, flash exposure may be carried out through a photomask employing a xenon lamp, a halogen lamp or a mercury lamp, or scanning exposure may be carried out employing a convergent laser light. Infrared laser, particularly a semiconductor laser having an output power of from 20 to 200 mW per one beam is preferably used. The energy density used is preferably from 50 to 500 mJ/cm$^2$, and more preferably from 100 to 300 mJ/cm$^2$.

As another light sensitive resin layer, a light sensitive resin layer can be preferably used, and a well-known positive working or negative working material can be used, but a laser sensitive material is preferably used. As such a material, there are (1) a dye sensitized photo-polymerizable light-sensitive material disclosed in Japanese Patent O.P.I. Publication Nos. 11-271969, 2001-117219, 11-311859, and 11-352691, (2) an infrared laser-sensitive negative working material disclosed in Japanese Patent O.P.I. Publication No. 9-179292, U.S. Pat. No. 5,340,699, and Japanese Patent O.P.I. Publication Nos. 10-90885, 2000-321780, and 2001-154374, and (3) an infrared laser-sensitive positive working material in Japanese Patent O.P.I. Publication Nos. 9-171254, 5-115144, 10-87733, 9-43847, 10-268512, 11-194504, 11-223936, 11-84675, 11-174681, 7-282575, and 2000-56452, WO97/39894, and WO98/42507. The material of item (2) or (3) above is preferred in that its use is not limited to use in the dark.

Solvents for preparing a coating liquid of the light sensitive resin layer include propylene glycol monomethyl ether, propylene glycol monoethyl ether, methyl cellosolve, methyl cellosolve acetate, ethyl cellosolve, ethyl cellosolve acetate, dimethylformamide, dimethylsulfoxide, dioxane, acetone, cyclohexanone, trichloroethylene, and methyl ethyl ketone. These solvents may be used singly or as a mixture of two or more kinds thereof.

As a method for forming a light sensitive resin layer, there is a coating method such as a spray coating method, a spin coating method, a blade coating method, a dip coating method, a casting method, a roll coating method, a bar coating method or a die coating method.

As a light source for the imagewise exposure of the light sensitive layer, laser is preferred, and examples of the laser include an argon laser, a semi-conductive laser, a He—Ne laser, a YAG laser, and a carbon dioxide gas laser, and a semi-conductive laser, which has an emission wavelength at the infrared wavelength regions, is preferred. The output power of the laser is suitably not less than 50 mW, and preferably not less than 100 mW, which forms an image with high accuracy.

The light sensitive layer is exposed and developed to form an insulating area. Adhesion between the light sensitive layer and the insulating layer varies due to the exposure, and the exposed light sensitive layer is developed with for example, a brush whereby the light sensitive layer at the exposed portions are removed to form an insulating area.

The method of the invention comprises forming a semiconductor layer, forming the insulating area on the formed semiconductor layer, then providing the electrode material as described above on the insulating area, wherein the insulating area separates the provided electrode material to form a source layer on one end of the insulating area and a drain electrode on the other end of the insulating area.

The semiconductor layer and its formation will be explained below.

<<Semiconductor Layer>>

The semiconductor layer in the invention can contain a known inorganic semiconductive material such as amorphous silicon or polysilicone or a known organic semiconductive material, and the semiconductor layer in the invention is preferably an organic semiconductor layer containing an organic semiconductive material.

(Organic Semiconductive Material)

As the organic semiconductive materials in the invention, π-conjugated materials are used. Examples of the π-conjugated materials include polypyrroles such as polypyrrole, poly(N-substituted pyrrole), poly(3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly(p-phenylenevinylene); polyanilines such as polyaniline, poly(N-substituted aniline), poly(3-substituted aniline), and poly(2,3-substituted aniline); polyacetylnenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group; polymers such as polyvinyl carbazoles, polyphenylene sulfide, and polyvinylene sulfide; and polycyclic condensation products described in Japanese Patent O.P.I. Publication No. 11-195790.

Further, oligomers having repeating units in the same manner as in the above polymers, for example, thiophene hexamers including α-sexithiophene, α, ω-dihexyl-α-sexithiophene, α,ω-dihexyl-α-quiinquethiophene, and α,ω-bis(3-butoxypropyl)-α-sexithiophene, or styrylbenzene derivatives, can be suitably employed.

Further, listed are metallophthalocyanines such as copper phthalocyanine, and fluorine-substituted copper phthalocyanines described in Japanese Patent O.P.I. Publication No. 11-251601; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tretracarboxylic acid diimide, N,N'-bis(1H,1H-perfluoroctyl) naphthalene 1,4,5,8-tetracarboxylic acid diimide derivatives, N,N'-bis(1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarbocylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines.

Of these π conjugated compounds, preferably employed is at least one selected from the group consisting of oligomers which have thiophene, vinylene, thienylenevinylene, phenylenevinylene, p-phenylene, their substitution product or at least two kinds thereof as a repeating unit and have a repeating unit number n of from 4 to 10, polymers which have the same unit as above and a repeating unit number n of at least 20, condensed polycyclic aromatic compounds such as pentacene, fullerenes, condensed cyclic tetracarboxylic acid diimides of condensed ring compounds, and metallo-phthalocyanines.

Further, employed as other materials for organic semiconductors may be organic molecular complexes such as a tetrathiafulvalene (TTF)-tetracyanoquinodimethane (TCNQ) complex, a bisethylenetetrathiafulvalene (BEDTTTF)-perchloric acid complex, a BEDTTTF-iodine complex, and a TCNQ-iodine complex. Still further, employed may be σ conjugated polymers such as polysilane and polygermane, as well as organic-inorganic composite materials described in Japanese Patent O.P.I. Publication No. 2000-260999.

In the invention, the organic semiconductor layer may be subjected to a so-called doping treatment (referred to also as simply doping) by incorporating in the layer, materials working as an acceptor which accepts electrons, for example, acrylic acid, acetamide, materials having a functional group such as a dimethylamino group, a cyano group, a carboxyl group and a nitro group, benzoquinone derivatives, or tetracyanoethylene, tetracyanoquinodimethane or their derivatives, or materials working as a donor which donates electrons, for example, materials having a functional group such as an amino group, a triphenyl group, an alkyl group, a hydroxyl group, an alkoxy group, and a phenyl group; substituted amines such as phenylenediamine; anthracene, benzoanthracene, substituted benzoanthracenes, pyrene, substituted pyrene, carbazole and its derivatives, and tetrathiafulvalene and its derivatives.

The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopant. As the dopant in the present invention, a known dopant can be used.

(Formation of Organic Semiconductor Layer)

The methods for forming the organic semiconductor layer include a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, an bar coating method, a die coating method, an ink jet method and an LB method. These methods may be used according to kinds of materials used. However, of these, a spin coating method, a blade coating method, a dip coating method, a roll coating method, a bar coating method, a die coating method, and an ink jet method are preferred in view of productivity in which a thin layer with high precision can be easily obtained employing a solution of an organic semiconductive material from the viewpoint of productive efficiency.

When a precursor such as pentacene is soluble in a solvent as disclosed in Advanced Material 1999, Vol. 6, p. 480-483, a precursor layer formed by coating of the precursor solution may be heat treated to form an intended organic material layer.

The thickness of the organic semiconductor layer is not specifically limited. The thickness of an active layer comprised of the organic semiconductor materials often has a great influence on properties of the resultant transistor. Accordingly, the thickness of the layer differs due to kinds of the organic semiconductor materials used, but it is ordinarily not more than 1 μm, and preferably from 10 to 300 nm.

When the electrode material is ejected on the insulating area according to the ink jet method, ink containing the electrically conductive material is used. As a solvent or a dispersion medium used in the ink, one is preferred which minimizes damage to the organic semiconductor (organic semiconductor layer). Degree of the damage depends on an organic semiconducting compound used, but when pentacene is used, a solvent or dispersion medium containing water in an amount of not less than 50%, more preferably not less than 60%, and most preferably not less than 90% is preferred.

A transparent conductive film comprised of the material described above can be used. Herein, "transparent" means that a light (UV-visible light) transmittance is not less than 50%, and preferably not less than 80%.

<<Intermediate Layer>>

One of the preferred embodiments of the organic thin-film transistor in the invention comprises an intermediate layer (hereinafter also referred to as organic semiconductor layer protective layer) in contact with the organic semiconductor layer. The intermediate layer, which is provided so as to be in contact with the organic semiconductor layer, can prevent deterioration of the organic semiconductor layer due to air or water. Further, the intermediate layer can provide excellent resistance to folding, whereby deterioration due to folding of performance of the transistor can be minimized.

The intermediate layer can provide an effect of minimizing damage to the organic semiconductor layer during formation of the insulating area, although the effect depends on kinds of a organic semiconductive material, a material for forming the insulating area or a solvent used.

As a material for the intermediate layer, a material is used which has no influence on the organic semiconductor layer during or after manufacture of an organic thin-film transistor element.

Examples of such a material include a phenol resin such as polyvinyl phenol or a novolak resin, an epoxy resin and a hydrophilic polymer.

The hydrophilic polymer hereinafter referred to is a polymer soluble or dispersible in water, an aqueous acidic or alkali solution, or an aqueous solution of various surfactants. Examples of the hydrophilic polymer include polyvinyl alcohol, a homopolymer or copolymer of HEMA, acrylic acid, or acryl amide. As another examples thereof, a material containing inorganic oxides or inorganic nitrides is also preferred, since it has no influence on the organic semiconductor layer and is not influenced during coating of another layer. Further, a material to be used in a gate insulating layer described later can be also used.

The intermediate layer containing inorganic oxides or inorganic nitrides is preferably formed according to an atmospheric pressure plasma method.

The plasma layer formation method at atmospheric pressure means a method wherein a reactive gas is plasma-excited by discharge conducted at atmospheric pressure or at approximately atmospheric pressure, whereby a thin-film is formed on a substrate. The method (hereinafter referred to also as an atmospheric pressure plasma method) is described in Japanese Patent O.P.I. Publication Nos. 11-61406, 11-133205, 2000-121804, 2000-147209, and 2000-185362. This method can form a thin film having high performance at high productivity.

<<Gate Insulating Layer>>

Various insulating layers may be employed as the gate insulating layer of the organic thin-film transistor of the invention. The insulating layer is preferably an inorganic oxide layer comprised of an inorganic oxide with high dielectric constant. Examples of the inorganic oxide include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum oxide or titanium oxide is particularly preferred. An inorganic nitride such as silicon nitride or aluminum nitride can be also suitably used.

The methods for forming the above layer include a dry process such as a vacuum deposition method, a molecular beam epitaxial growth method, an ion cluster beam method, a low energy ion beam method, an ion plating method, a CVD method, a sputtering method, or an atmospheric pressure plasma method, a wet process such as a spray coating method, a spin coating method, a blade coating method, a dip coating method, a casting method, a roll coating method, an bar coating method, or a die coating method, and a patterning method such as a printing method or an ink-jet method. These methods can be used due to kinds of materials used in the insulating layer.

As the typical wet process can be used a method of coating a dispersion liquid and drying, the liquid being obtained by dispersing inorganic oxide particles in an organic solvent or water optionally in the presence of a dispersant such as a surfactant, or a so-called sol gel method of coating a solution of an oxide precursor such as an alkoxide and drying.

Among the above, the preferred is an atmospheric pressure plasma method.

It is preferred that the gate insulating layer is comprised of an anodization film or an anodization film and an insulating film. The anodization film is preferably subjected to sealing treatment. The anodization film is formed on a metal capable of being anodized by anodizing the metal according to a known method.

Examples of the metal capable of being anodized include aluminum and tantalum. An anodization treatment method is mot specifically limited and the known anodization treatment method can be used. Anodization treatment forms an anodization film. An electrolytic solution used in the anodization treatment may be any as long as it can form a porous oxidation film. Examples of electrolytes in the electrolytic solution include sulfuric acid, phosphoric acid, oxalic acid, chromic acid, boric acid, sulfamic acid, benzene sulfonic acid or their salt, and a mixture thereof. Anodization treatment conditions cannot be specified since they vary due to kinds of an electrolytic solution used. Generally, the concentration of the electrolytic solution is from 1 to 80% by weight, temperature of the electrolytic solution is from 5 to 70 C, electric current density is from 0.5 to 60 A/dm2, voltage applied is from 1 to 100 V, and electrolytic time is from 10 seconds to 5 minutes. It is preferred that an aqueous solution of sulfuric acid, phosphoric acid or boric acid is used as an electrolytic solution, and direct current is used. Alternating current can be also used. Anodization treatment is preferably carried out at an electric current density of from 0.5 to 20 A/dm2 at an electrolytic solution temperature of from 20 to 50 for 20 to 250 seconds.

Examples of the organic compound used in an organic compound layer include polyimide, polyamide, polyester, polyacrylate, a photo-curable resin such as a photo-radical polymerizable or photo-cation polymerizable resin, a copolymer containing an acrylonitrile unit, polyvinyl phenol, polyvinyl alcohol, novolak resin, and cyanoethylpullulan.

As a method of forming the organic compound layer, the wet process described above is preferably used.

An inorganic oxide layer and an organic oxide layer can be used in combination and superposed. The thickness of the insulating layer is generally 50 nm to 3 μm, and preferably from 100 nm to 1 μm.

An orientation layer may be provided between the gate insulating layer and the organic semiconductor layer. As the orientation layer, a self organization layer is preferably used which is formed from a silane coupling agent such as octadecyltrichlorosilane or trichloromethylsilane, alkane phosphoric acid, alkane sulfonic acid, or an alkane carboxylic acid.

<<Material for a Gate Electrode>>

As a material for a gate electrode, the same materials or electrically conductive material as denoted in the source or drain electrode above can be used. As methods for forming the gate electrode, the methods as denoted in the gate insulating layer above are used.

<<Substrate>>

The substrate in the invention will be explained below.

In the invention, the substrate is a resin sheet comprised of a resin. Examples of the resin sheet include resin sheets comprised of, for example, polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of such a resin sheet makes it possible to decrease weight, to enhance portability, and tb enhance durability against impact due to its flexibility, as compared to glass.

In the invention, a transistor protective layer can be provided on the organic thin-film transistor of the invention. Materials for the transistor protective layer include inorganic oxides or nitrides described above, and the transistor protective layer is preferably formed according to the atmospheric pressure plasma method, whereby resistance of the organic thin-film transistor is improved.

<<Subbing Layer>>

The organic thin-film transistor of the invention comprises a subbing layer containing a compound selected from inorganic oxides or inorganic nitrides or a subbing layer containing a polymer.

The inorganic oxides contained in the subbing layer include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. The inorganic nitrides include silicon nitride and aluminum nitride.

Of these, silicon oxide, aluminum oxide, tantalum oxide, titanium oxide or silicon nitride is preferred.

In the invention, the subbing layer containing a compound selected from inorganic oxides or inorganic nitrides is preferably formed according to the atmospheric pressure plasma method described above.

Examples of the polymer used in the subbing layer include a polyester resin, a polycarbonate resin, a cellulose resin, an acryl resin, a polyurethane resin, a polyethylene resin, a polypropylene resin, a polystyrene resin, a phenoxy resin, a norbornene resin, an epoxy resin, vinyl chloride-vinyl acetate copolymer, a vinyl chloride resin, vinyl acetate-vinyl alcohol copolymer, a partially saponificated vinyl chloride-vinyl acetate copolymer, vinyl chloride-vinylidene chloride copolymer, vinyl chloride-acrylonitrile copolymer, ethylene-vinyl alcohol copolymer, polyvinyl alcohol, chlorinated polyvinyl chloride, ethylene-vinyl chloride copolymer, ethylene-vinyl acetate copolymer, a polyamide resin, an ethylene-butadiene resin, a butadiene-acrylonitrile resin, a silicone resin, and a fluorine-contained resin.

The present invention is a thin-film transistor sheet comprising a gate busline, a drain busline, and a thin-film transistor comprising a substrate and provided thereon, a gate electrode, a gate insulating layer, a semiconductor layer, a source electrode and a drain electrode, the plural thin-film transistors being connected with each other through the gate busline and the source busline, and a manufacturing method thereof comprising the steps of forming the semiconductor layer on the substrate, forming an insulating area, which is electrode material-repellent, on the substrate or on the semiconductor layer, and providing an electrode material on the insulating area side to form a source electrode on one end of the insulating area and a drain electrode on the other end of the insulating area. The insulating area is formed providing an electrode material-repellent material on the substrate or on the semiconductor layer.

In this method of the invention, the semiconductor layer preferably crosses the gate busline. Herein, "the semiconductor layer crosses the gate busline" also implies that the semiconductor layer contacts the gate busline.

This method will be explained below employing FIGS. 9($a$), 9($b$), and 9($c$).

Figure 9:
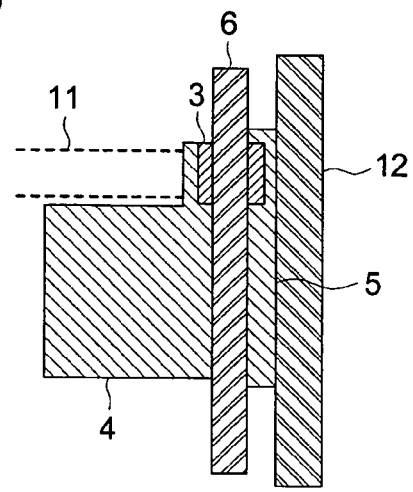
FIGS. 9(*a*), 9(*b*), and 9(*c*) each shows a structure example of an organic thin-film transistor constituting one pixel of a thin-film transistor sheet.
Figure 9:
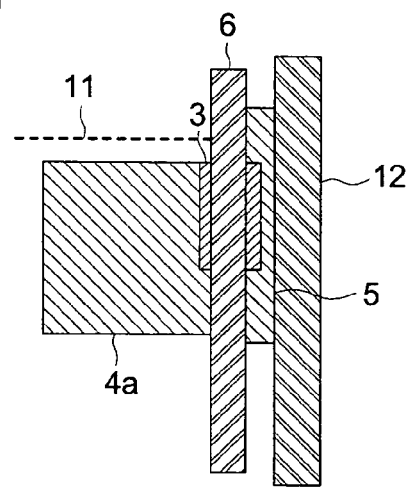
Figure 9:
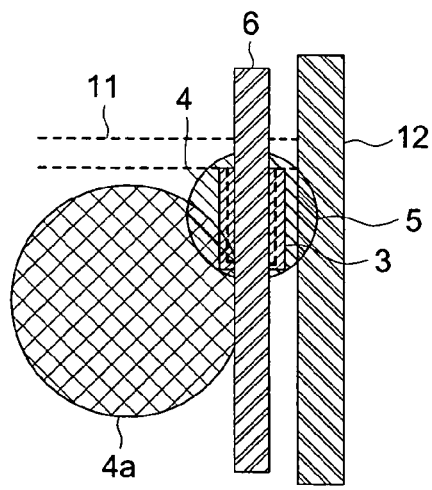

FIGS. 9($a$), 9($b$), and 9($c$) each show a structure example of an organic thin-film transistor constituting one pixel in the thin-film transistor sheet in the invention.

In FIG. 9($a$), an organic semiconductor layer 3 is provided so as to cross a gate busline 11 (where the gate busline 11 is shown in dotted line, as it is covered with a gate insulating layer not illustrated), an insulating area (an electrode material-repellent area) 6 is provided on the organic semiconductor layer 3, and a drain electrode 4 is provided on one side of the insulating area 6, and a source layer 5 on the other side of the insulating area 6. Herein, the gate busline serves also as a gate electrode. Numerical number 12 shows a source busline.

In FIG. 9($b$), a gate electrode is branched from the gate busline 11, the organic semiconductor layer 3 is provided on the branched gate electrode, and a source electrode 5 and a drain electrode are provided so as to contact the organic semiconductor layer. A pixel electrode 4$a$ is formed on the drain electrode 4. Herein, the pixel electrode 4$a$ may serve also as a drain electrode 4. Numerical number 12 shows a source busline.

FIG. 9($c$) is a schematic view showing a source electrode, a drain electrode and a pixel electrode which are formed from two dots supplied as ink droplets according to an ink jet method. After the insulating area 6 and a source busline 12 were formed, an electrode material was supplied as droplets on the organic semiconductor layer 3 and the insulating area 6 provided thereon, and separated on the insulating area 6 to form a source electrode and a drain electrode. Accordingly, one droplet of the electrode material forms a source electrode and a drain electrode, and the source electrode is connected to the source busline. The pixel electrode is also from one droplet, and is connected to the drain electrode. Herein, the pixel electrode 4$a$ is separated from the source electrode 5 or the source busline 12 by the insulating area 6 to prevent electrical short. The volume of droplets of the electrode material is controlled according to an intended size of the electrode to be formed. For example, if a larger pixel electrode is desired, a higher volume of the electrode material droplet is ejected onto the intended position by an ink jet method. According to the method of the invention as described above, the electrodes can be easily formed.

<<Electrode Material-repellent Area (Insulating Area)>>

In this method, the insulating layer is the same as described above in the thin-film transistor, and is formed in the same manner as in the thin-film transistor described above.

<<Electrode Material, Electrode Material for Source Electrode and Drain Electrode>>

In this method, the source electrode and the drain electrode are the same as described above in the thin-film transistor, and are formed in the same manner as in the thin-film transistor described above.

Further, the gate electrode, the semiconductor layer, and the gate insulating layer are the same as described above in the thin-film transistor, and they are formed in the same manner as in the thin-film transistor described above. The substrate is the same as described above in the thin-film transistor.

Figure 10:
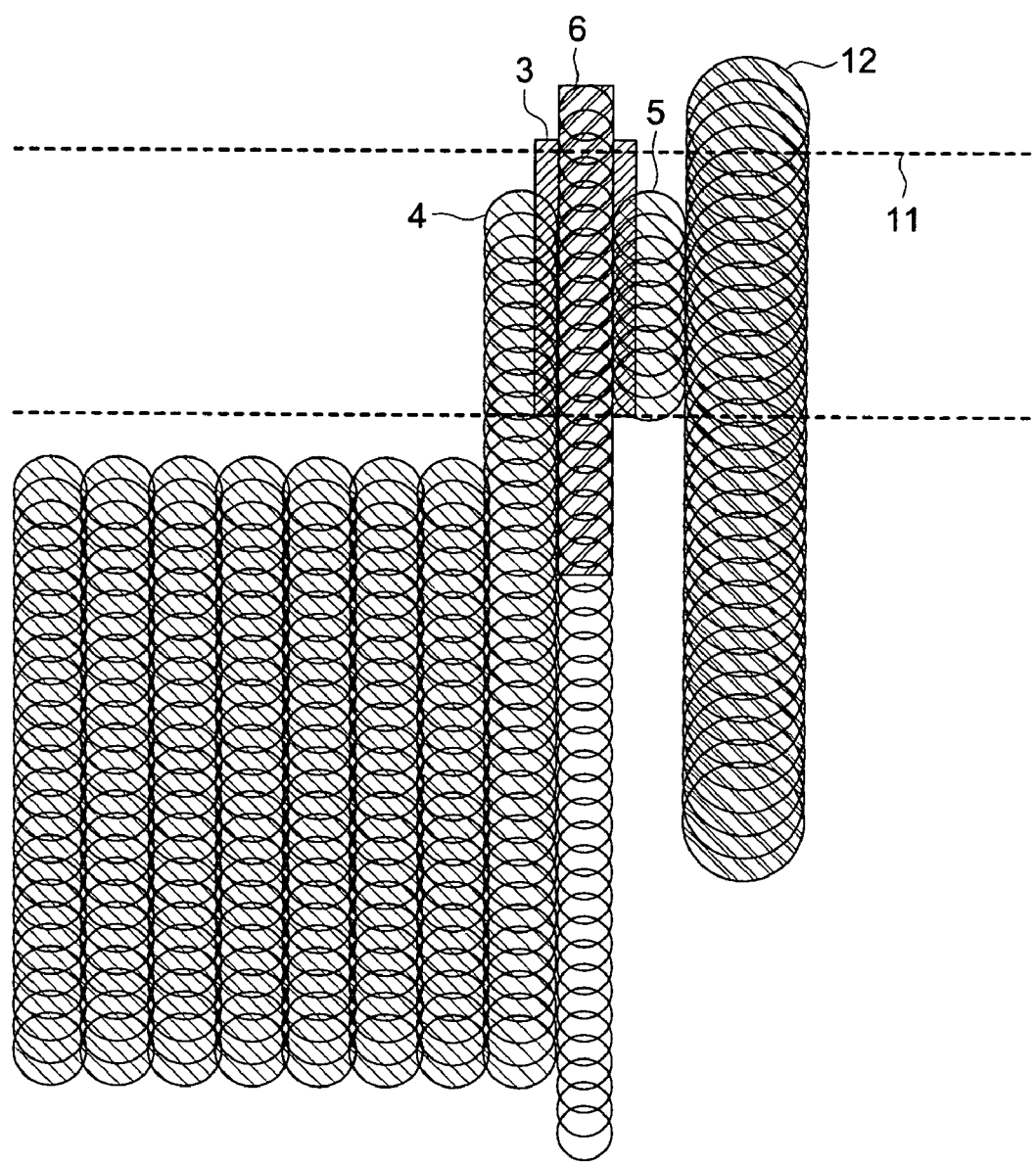
FIG. 10 shows one embodiment of the method of the invention of manufacturing a thin-film transistor sheet according to an ink jet method.

Next, one embodiment of the method of the invention, employing an ink jet method, will be explained with reference with FIG. 10. In FIG. 10, formation of insulating area 6, source electrode 5, drain electrode 4, and source busline 12 will be explained.

A channel comprised of a semiconductor layer 3 is provided so as to cross the gate busline 11, which serves also as a gate electrode, and the insulating area (electrode material-repellent area) 6 is formed on the channel. After, that, ink droplet comprised of a solution or dispersion containing the electrode material is supplied to both ends of the insulating area 6 or is supplied onto the insulating area to separate into two, whereby the source electrode 5, the drain electrode 4, and the pixel electrode are formed.

The source busline 12 is also formed by an ink jet method. It is preferred that the source busline 12 is formed prior to the formation of the source electrode, which prevents undesirable enlargement of the source electrode material droplets.

The method of manufacturing a thin-film transistor sheet comprises forming the insulating area and then providing an electrode material on the entire surface of the sheet substrate to form an electrode, which provides a method of easily manufacturing a thin-film transistor sheet with extremely high productivity.

As a method of supplying an electrode material over the entire surface of a sheet substrate, an ink jet method is preferably used in which ink jet printing is carried out. It is preferred that the ink jet printing is carried out while the substrate is transported. It is more preferred that an insulating area is linearly formed while the substrate is transported in the direction crossing the gate busline, and then a source electrode, a drain electrode and/or a source busline are formed by supplying an electrode material. It is also preferred that the drain electrode and the pixel electrode are simultaneously formed.

Embodiments, in which an insulating area is linearly formed in the thin-film transistor sheet, will be explained below employing FIGS. 11 to 14.

Figure 11:
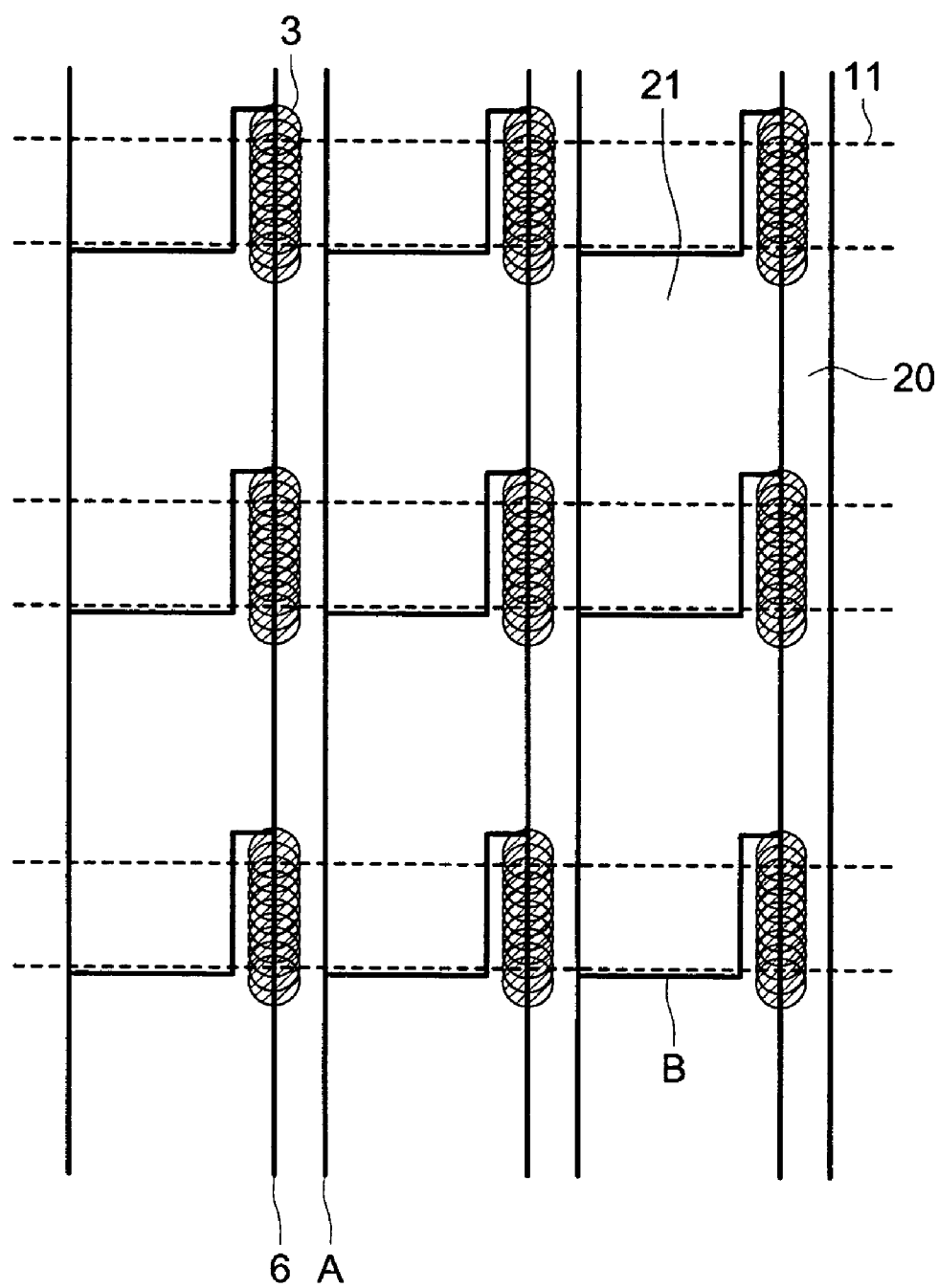
FIG. 11 shows a schematic view of one embodiment in which an insulating area is linearly formed in a thin-film transistor sheet.

FIG. 11 shows a schematic view of one embodiment in which an insulating area is linearly formed in the thin-film transistor sheet.

In FIG. 11, the organic semiconductor layer 3 is formed to cross the gate busline 11. For example, the semiconductor layer is formed by ejecting a solution or dispersion of an organic semiconductive material onto the sheet substrate (not illustrated) according to an ink jet method. Subsequently, while the substrate is transported in the direction crossing the gate busline 11, the insulating area 6 is linearly formed.

A preferred method of linearly forming the insulating area 6 is an ink jet method or a printing method.

The line of the insulating area 6 provides a channel. Lines A and B are formed on the sheet substrate at the same time as the insulating area line, whereby areas 20 and 21 are formed. Lines A and B are not essential. The lines A and B may be formed from the electrodes as shown, for example, in FIG. 9(c) or FIG. 10.

In FIG. 11, the electrode material is supplied to area 20 to form a source electrode or a source busline, and to area 21 to form a drain electrode or a pixel electrode. A storage capacitance is formed between the area 21 and the adjacent gate busline.

FIG. 11 shows a structure in which the gate busline serves also as a gate electrode. The structure provides a TFT sheet which does not produce problem even if the semiconductor layer, insulating area 6, and areas A and B are a little shifted to the gate busline direction.

A material for a source electrode and a material for a source busline may be the same or different. When a material for a source electrode and a material for a source busline is different, the material for a source electrode is supplied onto a sheet substrate and then the material for a source busline is supplied onto the sheet substrate, or the material for a source busline is supplied onto a sheet substrate and then the material for a source electrode is supplied onto the sheet substrate, or the material for a source busline and the material for a source electrode are simultaneously supplied onto a sheet substrate.

Figure 12:
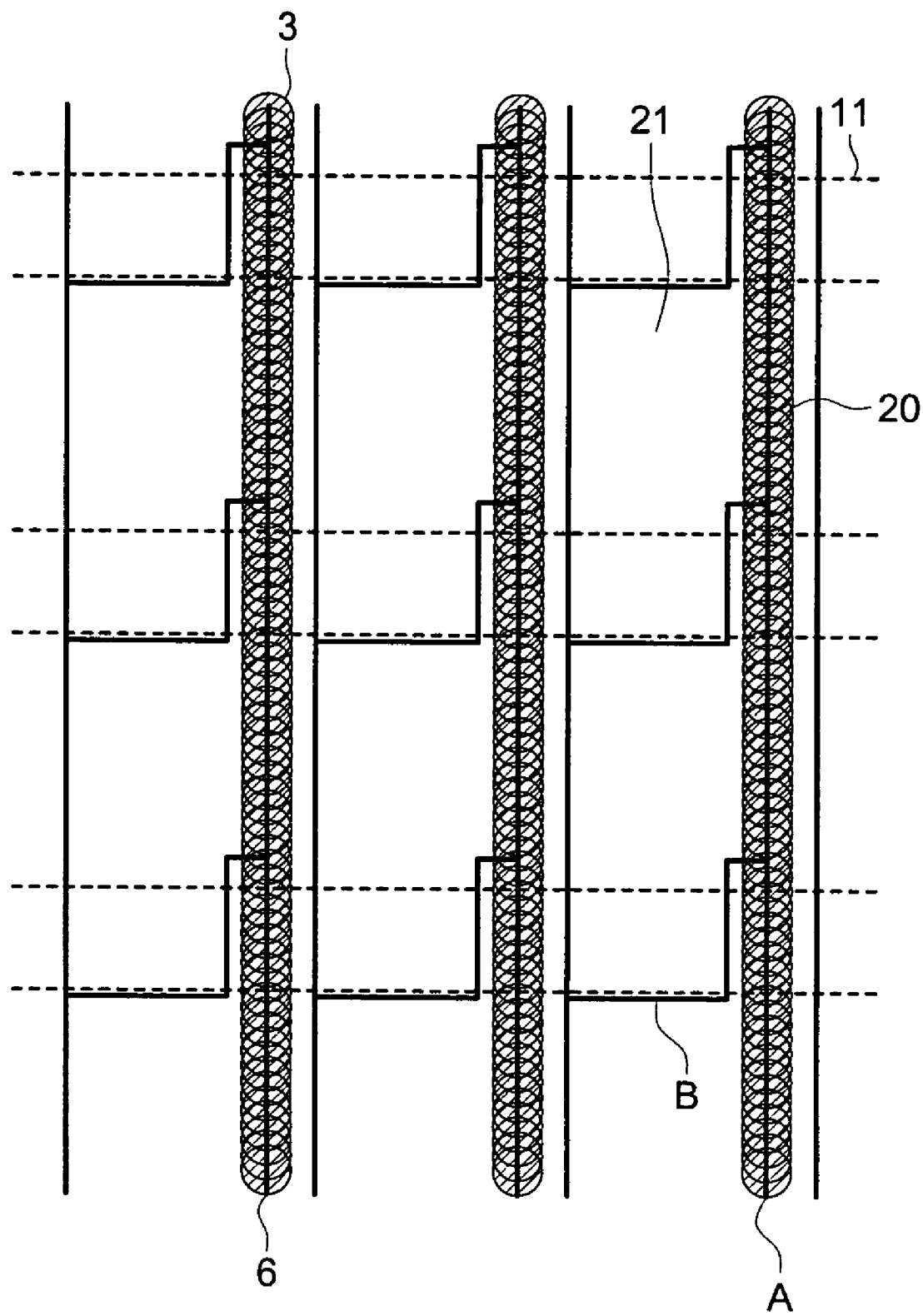
FIG. 12 shows a schematic view of another embodiment in which an insulating area is linearly formed in a thin-film transistor sheet.

FIG. 12 shows a schematic view of another embodiment in which an insulating area is linearly formed in the thin-film transistor sheet.

FIG. 12 shows the same structure as FIG. 11, except that the channel of an organic semiconductor layer 3 is formed over the line of the insulating area 6. The organic semiconductor layer 3 and the insulating area 6 can be easily formed employing, for example, a continuous ink jet printer, and preferably an ink jet printer with a fixed multi nozzle head in which an interval between the nozzles is constant.

Figure 13:
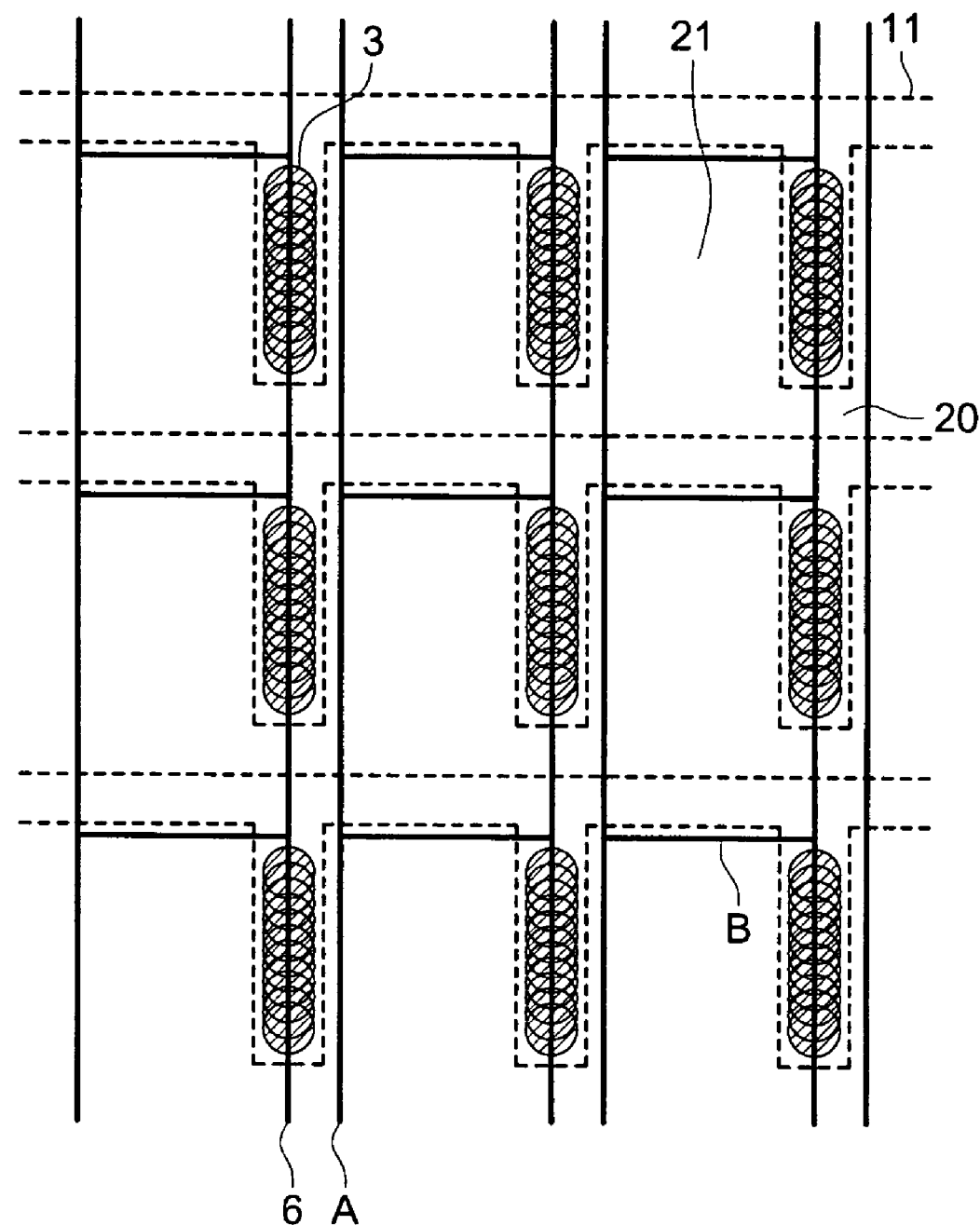
FIG. 13 shows a schematic view of further another embodiment in which an insulating area is linearly formed in a thin-film transistor sheet.

FIG. 13 shows a schematic view of further another embodiment in which an insulating area is linearly formed in the thin-film transistor sheet.

FIG. 13 shows the same structure as FIG. 11, except that the gate electrode is separated from the gate busline 11, and the organic semiconductor layer 3 is formed in the protrusions of the gate electrode.

Figure 14:
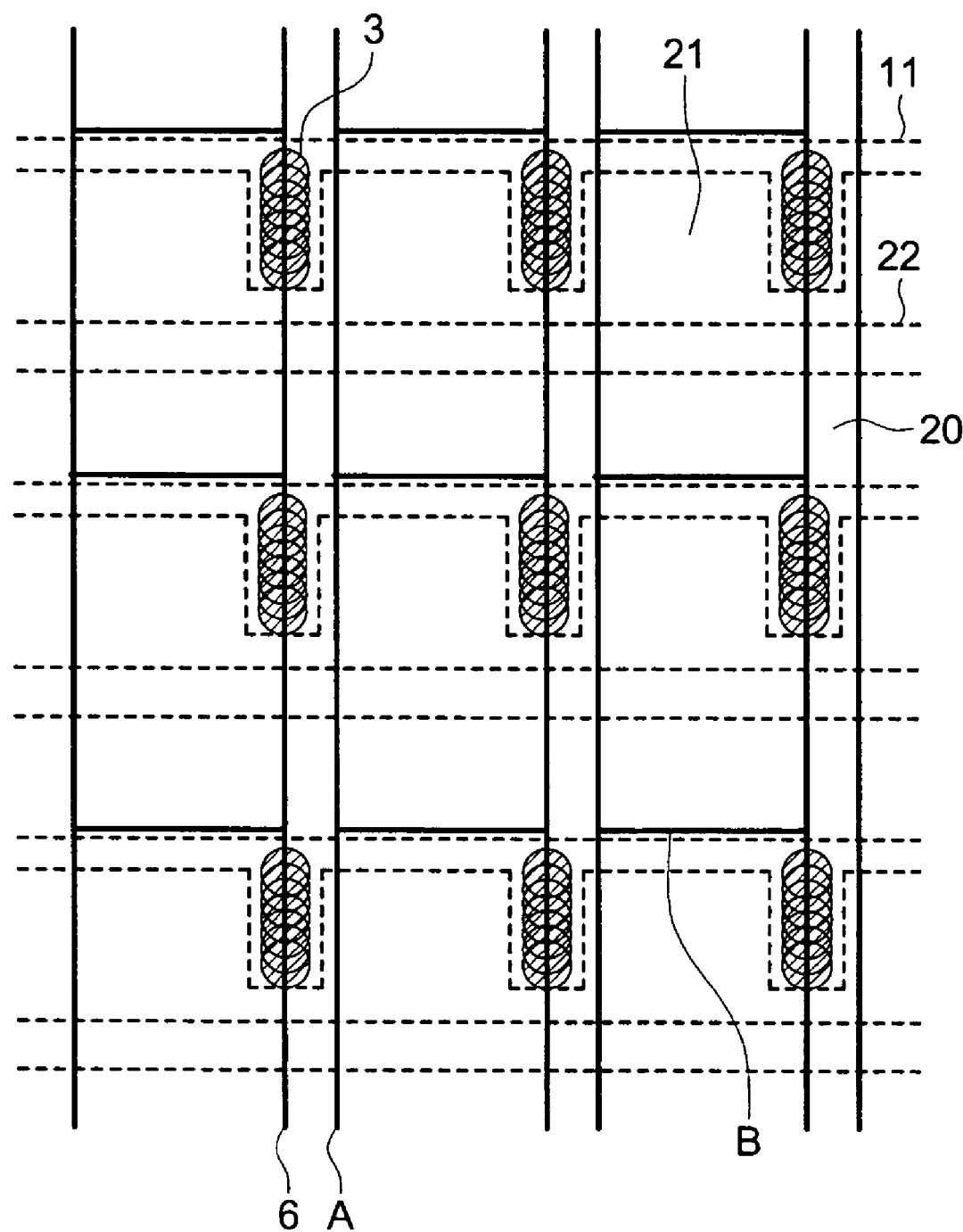
FIG. 14 shows a schematic view of still further another embodiment in which an insulating area is linearly formed in a thin-film transistor sheet.

FIG. 14 shows a schematic view of still further another embodiment in which an insulating area is linearly formed in the thin-film transistor sheet.

FIG. 14 shows the same structure as FIG. 13, except that a capacitor line is provided to face the gate bus line 11.

In FIGS. 11 through 14, as a material for the source electrode, the drain electrode, the source busline, and the gate busline, the electrode materials described above are used, and a conductive paste (or ink) containing a conductive polymer or metal particles such as an aqueous dispersion (BAYTRON P produced by Bayer Co., Ltd.) of polystyrene sulfonic acid and poly(ethylenedioxythiophene), a silver paste, or an aqueous dispersion containing metal particles disclosed in Japanese Patent O.P.I. Publication No. 11-80647 is preferably used.

The present invention is a method of manufacturing an electric circuit comprising a substrate, and provided thereon, an electrode, the method comprising the steps of forming an insulating area, which is electrode material-repellent, on the substrate, and providing an electrode material on the insulating area side to form an electrode at potions on the substrate other than the insulating area. In this method, the electrode are the same as the source or drain electrode described above in the thin-film transistor, and are formed in the same manner as in the source or drain electrode of the thin-film transistor described above.

Further, the electrode and the insulating layer are the same as described above in the thin-film transistor, and they are formed in the same manner as in the thin-film transistor described above. The substrate is also the same as described above in the thin-film transistor.

The insulating area is preferably comprised of a silicone rubber layer. The thickness of the insulating area in the electrical circuit is preferably from 0.05 to 100 μm, and more preferably from 0.5 to 20 μm.

The forming of the insulating area or the electrode is preferably carried out by an ink jet method. The providing of the electrode material is preferably carried out by an ink jet method. The formation of the insulating area is preferably carried out by providing a light sensitive layer on the substrate, providing an electrode material-repellent insulating layer on the light sensitive layer, exposing the resulting material and developing the exposed material. The light sensitive layer is preferably an ablation layer, which is described above.

EXAMPLES

Next, the present invention will be explained employing examples, but is not limited thereto.

Example 1

<<Preparation of Thin-film Transistor Sample 1>>Bottom Gate Type

A thin-film transistor sample 1, having a layer structure as shown in FIG. 1(a), was prepared according to the following procedures.

In the procedures, procedures 1 through 3 will be explained employing FIG. 3(1) through 3(6). FIG. 1(a) has the same structure as FIG. 3(6).

Procedure 1: FIG. 3(1) Gate electrode 2, gate insulating layer 2a, and organic semiconductor layer 3 were provided on a substrate 1 as follows to obtain a layer structure as shown in FIG. 3(1).

<Preparation of Substrate>

The surface of substrate 1 of a 200 μm thick PES film was corona discharged at 50 W/m²/min and then coated with a coating liquid having the following composition to obtain a layer of a dry thickness of 2 μm. The resulting layer was dried at 50° C. for 5 minutes, and hardened by being exposed for 4 seconds employing a 60 W/cm high pressure mercury lamp 10 cm distant from the layer.

| Dipentaerythritol hexacrylate monomer | 60 g |
|---|---|
| Dipentaerythritol hexacrylate dimmer | 20 g |
| Dipentaerythritol hexacrylate trimer or polymer higher than the trimer | 20 g |
| Diethoxybenzophenone (UV-initiator) | 2 g |
| Silicon-containing surfactant | 1 g |
| Methyl ethyl ketone | 75 g |
| Methyl propylene glycol | 75 g |

The resulting hardened layer was subjected to continuous atmospheric pressure plasma treatment under the following condition to give a 50 nm thick silicon oxide layer (a subbing layer not illustrated) on the hardened layer.

(Gas Used)

| Inert gas: Helium | 98.25% by volume |
|---|---|
| Reactive gas 1: an oxygen gas | 1.5% by volume |
| Reactive gas 2: tetraethoxysilane vapor (bubbled with a helium gas) | 0.25% by volume |
| (Condition of discharge) | |
| Discharge output power: | 10 W/cm² |

(Condition of Electrodes)

Electrodes used were prepared as follows:

A stainless steel jacket roll base material having a cooling device (not illustrated in FIG. 2) employing chilled water was coated with an alumina thermal spray layer. After that, a solution prepared by diluting tetramethoxysilane with ethyl acetate was coated on the resulting electrode, dried, hardened by UV ray irradiation to carry out sealing treatment, and smoothed to give an dielectric layer (dielectric constant: 10) with an Rmax (defined according to JIS B 0601) of 5 μm on the surface of the material. Thus, a roll electrode was obtained. Further, a hollow prismatic stainless steel pipe was processed in the same manner as above to obtain a hollow prismatic electrode as a voltage application electrode. The roll electrode was grounded.

(Formation of Gate Electrode)

A light sensitive resin layer 1 having the following composition was coated on the subbing layer above, and dried at 100° C. for 1 minute to form a light sensitive resin layer with a thickness of 2 μm.

(Light Sensitive Resin Layer 1)

| Dye A | 7 parts |
|---|---|
| Novolak resin | 90 parts |

(Condensation Product of Phenol, m-, p-mixed Cresol, and Formaldehyde, Mw=4,000, Phenol: m-cresol: p-cresol=5: 57:38 by Mole)

| Crystal violet | 3 parts |
|---|---|
| Propylene glycol monomethyl ether | 1000 parts |

Dye A

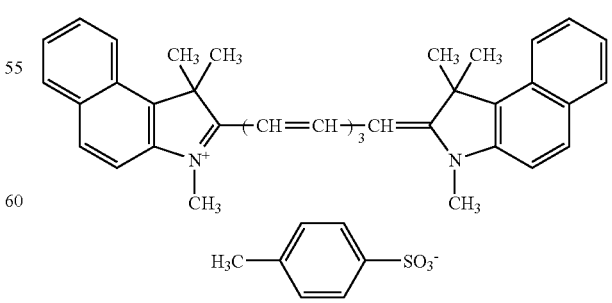

The light sensitive resin layer was exposed at an energy density of 200 mJ/cm² employing a 100 mW semiconductor laser emitting 830 nm light to give a gate electrode pattern, and developed with an alkali developing solution to form a resist.

A 300 nm thick aluminum layer was formed on the entire surface of the developed material according to a sputtering method, and the resist was removed with MEK to obtain a gate electrode 2.

(Formation of Anodization Film)

The resulting material was sufficiently washed, and anodized in an aqueous 50 g/liter ammonium borate solution by supplying direct current for 5 minutes through a 100V constant voltage power source to give an anodization film (not illustrated) with a thickness of 120 nm. The resulting layer was sufficiently washed with ultra pure water.

(Formation of Gate Insulating Layer)

The resulting layer was subjected to atmospheric pressure plasma discharge treatment at 200° C. to obtain a 30 μm thick titanium oxide layer (a gate insulating layer 2a) in the same manner as above, except that the following gas was used.

(Gas Used)

| | |
|---|---|
| Inert gas: Helium | 98.25% by volume |
| Reactive gas 1: an oxyen gas | 1.5% by volume |
| Reactive gas 2: tetraethoxysilane vapor (bubbled with helium gas) | 0.25% by volume |

(Formation of Organic Semiconductor Layer)

A chloroform solution of Compound C described later was ejected onto a portion of the gate insulating layer 2a where channel was to be formed, employing a piezo type ink jet printer, dried at 50° C. for 3 minutes, and heated at 200° C. for 10 minutes to obtain an organic semiconductor layer 3 of a 50 nm thick pentacene film.

Compound C

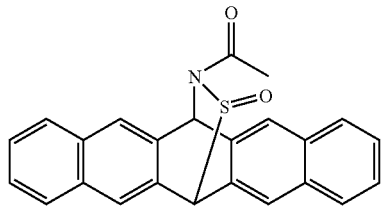

Procedure 2: FIGS. 3(2) and 3(3), Formation of Insulating Area

As shown in FIGS. 3(2) and 3(3), an electrode material-repellent material, a silicone adhesive SE9185 (produced by Toray Dow Corning silicone Co., Ltd.) was provided as ink droplet 6a on the organic semiconductor layer 3 provided on the substrate 1 according to a screen printing method, and hardened at 50° C. to obtain insulating area 6 comprised of a silicone rubber layer with a thickness of 3 μm and a width of 20 μm, a first area 3-1, a second area 3-2 and a third area 3-3 being formed on the organic semiconductor layer 3 provided on the substrate 1, wherein the electrode material-repellent material is provided on the first area 3-1 and not on the second area 3-2 and on the third area 3-3.

Procedure 3: FIGS. 3(4) through 3(6), Formation of Source Electrode and Drain Electrode An aqueous dispersion (BAYTRON P produced by Bayer Co., Ltd.) of polystyrene sulfonic acid and poly(ethylenedioxythiophene), which was an electrode material, was ejected on the insulating area 6 as ink droplet 8 according to an ink jet method, as shown in FIG. 3(4), separated into droplets 8a and 8b so that the separated droplets were provided on both sides (second area 3-2 and third area 3-3) of the insulating area 6, as shown in FIG. 3(5), and then dried at 60° C. to form a source electrode 5 on the second area 3-2 and a drain electrode 4 on the third area 3-3, as shown in FIG. 3(6).

Figure 5A:
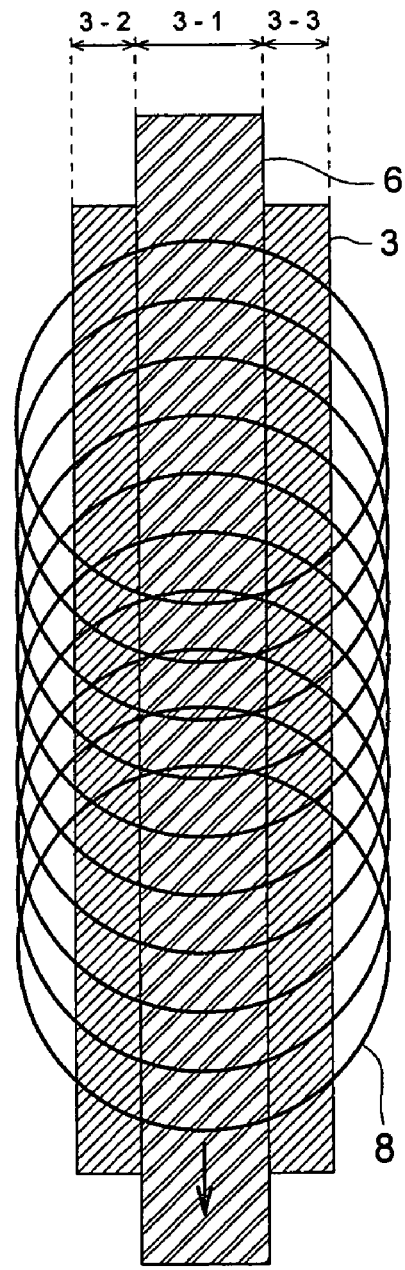
FIG. 5(*a*) is an illustration in which an electrode material is ejected onto an insulating area according to an ink jet method as ink droplet.
Figure 5B:
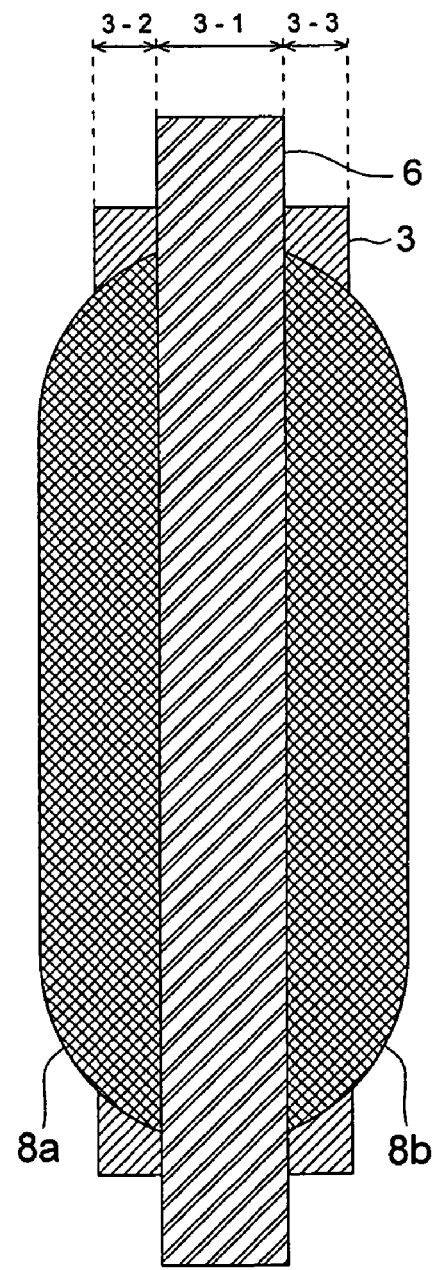

FIG. 5(a) is an illustration of FIG. 3(4) viewed from the organic semiconductor layer side in the direction perpendicular to the substrate 1, and FIG. 5(b) an illustration of FIG. 3(5) viewed from the organic semiconductor layer side in the direction perpendicular to the substrate 1.

As shown in FIG. 5(a), the electrode material, immediately after ejected, existed, as ink droplets 8, on both organic semiconductor layer 3 and insulating area 6 provided on the first area 3-1. However, as time elapsed, the ejected electrode material was separated into ink droplets 8a and ink droplets 8b by the insulating area 6 as shown in FIG. 5(b). Finally, as shown in FIGS. 3(5) and 3(6), ink droplets 8a and 8b form a source electrode 5 on the second area 3-2 and a drain electrode 4 on the third area 3-3, respectively.

Further, adjusting ink jet nozzles of an ink jet printer, ink droplets can be separated into ink droplets 8a and 8b to be ejected on both sides of the insulating area 6, as shown in FIG. 6(a), and can form a source electrode 5 and a drain electrode 4, respectively, as shown in FIG. 6(b).

Thus, thin-film transistor sample 1 was prepared.

The thin-film transistor sample 1 exhibited good working property as a p-channel enhancement type FET, and had a carrier mobility at saturated region of 0.2. The ON/OFF ratio (a ratio of drain currents when a source drain bias Vd was −50 V and a gate bias Vg was −30V and when a source drain bias Vd was −50 V and a gate bias Vg was 0V) was 500,000.

Example 2

Thin-film transistor sample 2 was prepared in the same manner as in thin-film transistor sample 1 of Example 1, except that the insulating area 6 was formed employing a composition, which was obtained kneading a mixture of the silicone adhesive and carbon (content ratio 2:1 by weight), instead of the silicone adhesive. The thin-film transistor sample 2 was evaluated in the same manner as in Example 1.

The thin-film transistor sample 2 exhibited the same good working property as thin-film transistor sample 1. A white light transmittance of the insulating layer of this sample 2 was 0.1%, and when the sample was operated under a fluorescent lamp of 3000 Lux, its property did not vary.

Example 3

Thin-film transistor sample 3 was prepared in the same manner as in thin-film transistor sample 1 of Example 1, except that an organic semiconductor layer, a source electrode and a drain electrode were formed as follows:

1. Formation of Organic Semiconductor Layer

A chloroform solution of regioregular poly(3-hexylthiophene), (produced by Ardrich Co., Ltd.), which had been purified to have a Zn and Ni content of not more than 10 ppm, was prepared. This solution was ejected employing a piezo type ink jet printer, dried at room temperature and heat treated at 50° C. for 30 minutes in a nitrogen atmosphere to form an organic semiconductor layer of poly(3-hexylthiophene) with a thickness of 30 nm.

2. Formation of Source Electrode and Drain Electrode

A silver paste Dotite D-550 (produced by Fujikura Kasei Co., Ltd.) was coated on the insulating area, and dried to form a source electrode and a drain electrode.

The thin-film transistor sample 3 exhibited good working property as a p-channel enhancement type FET, and had a carrier mobility at saturated region of 0.03. The ON/OFF ratio (a ratio of drain currents when a source drain bias Vd was −50 V and a gate bias Vg was −30V and when a source drain bias Vd was −50 V and a gate bias Vg was +10V) was 270,000.

Example 4

<<Preparation of Thin-film Transistor Sample 4>>

Thin-film transistor sample 4 was prepared as shown in FIGS. 7(1) through 7(7), in the same manner as in thin-film transistor sample 1 of Example 1, except that an ink receptive layer was provided on the organic semiconductor layer 3, as shown in FIG. 7(2), and an insulating area 6 was provided as described below, to form a source electrode 5 and a drain electrode 4 in the ink receptive layer 7 as shown in in FIG. 7 (7). Thus, thin-film transistor sample 4 was prepared as shown in FIG. 1(b). FIG. 7(1) is the same as FIG. 3(1).

<<Formation of Insulating Area>>

Figure 4:
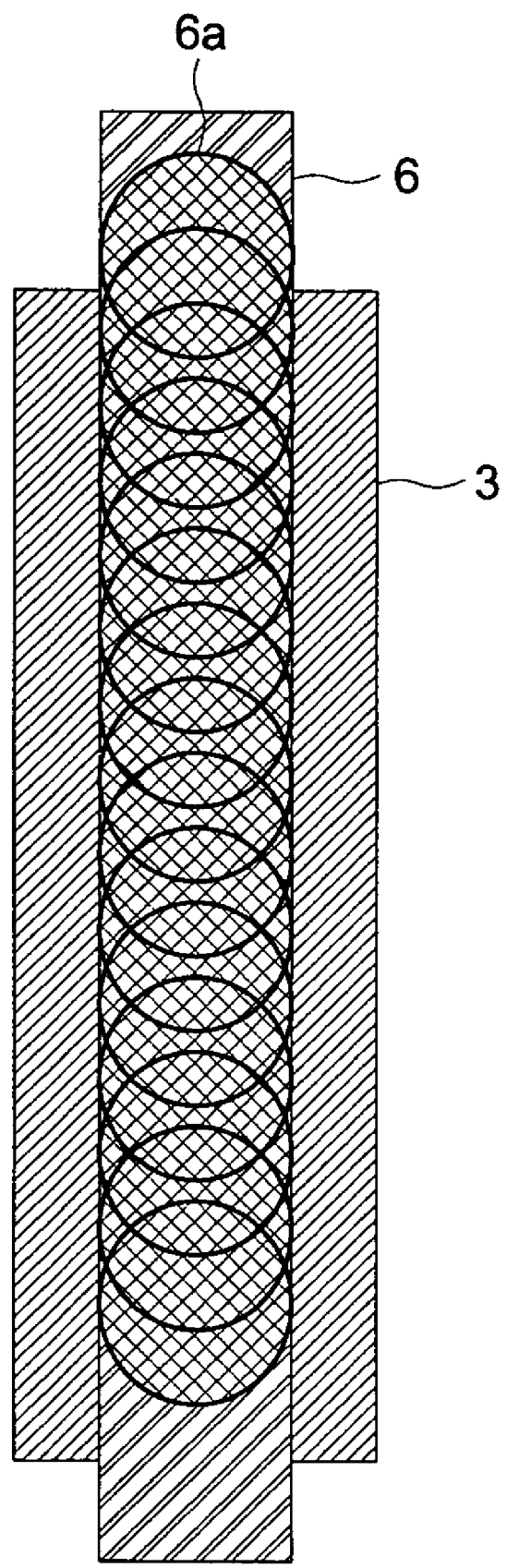
FIG. 4 is an illustration in which an insulating area is formed on the channel of a thin-film transistor.

A silicone rubber solution, in which the following composition 2 was dissolved in Isopar E (isoparaffin type hydrocarbon, produced by Exxon Co. Ltd.) to give a-solid content of 10.3% by weight, was ejected, as ink droplets 6a, on the organic semiconductor layer 3 according to an ink jet method, as shown in FIG. 7(3) and FIG. 4, and dried to form an insulating area 6 with a thickness of 0.4 μm comprised of silicone rubber in the ink receptive layer 7, as shown in FIG. 7(4).

(Composition 2)

| | |
|---|---|
| α, ω-Divinylpolydimethylsiloxane (Molecular weight 60,000)] | 100 parts |
| HMS-501 (Methylhydrogensiloxane-dimethylsiloxane copolymer having methyl groups on the chain ends, SiH number/molecular weight = 0.69 mol/g, produced by Chisso Co., Ltd.) | 7 parts |
| Vinyltris(methylethylketoxyimino)silane | 3 parts |
| SRX-212 (platinum catalyst, produced by Toray Dow Corning Silicone Co., Ltd.) | 5 parts |

FIG. 1(b) and FIG. 7(7) have the same structure.

Preparation of an ink receptive layer coating liquid for an ink receptive layer 7 was as follows.

(Preparation of Ink Receptive Layer Coating Liquid)

A coating liquid for ink receptive layer 7 was prepared as follows:

A gas phase-treated silica, AEROSIL 300 (with a primary particle size of 7 nm) (produced by Nippon Aerosil Co., Ltd.) of 0.6 kg were suction dispersed in 3 kg of colloidal silica, (20% aqueous dispersion of silica particles with a primary particle size of 10 to 20 nm, produced by Nissan Kagaku Co., Ltd.), and added with pure water to make a 7 liter aqueous dispersion. The resulting aqueous dispersion were mixed with a 0.7 liter aqueous solution containing 27 g of boric acid and 23 g of borax and 1 g of anti-foaming agent (SN381 produced by San Nopco Co., Ltd.)

The resulting mixture was dispersed in a high pressure homogenizer twice at a pressure $2.45 \times 10^7$ Pa to obtain a silica aqueous dispersion. To 1 liter of the resulting silica aqueous dispersion was added 1 liter of an aqueous 5% polyvinyl alcohol solution at 40° C. with stirring. Thus, an ink receptive layer coating liquid was obtained.

The coating liquid was ejected as ink droplets on the organic semiconductor layer according to an ink jet method, and dried at 100 C in a nitrogen atmosphere to form an ink receptive layer with a thickness of 2 μm.

In FIG. 7(5), numerical number 8 is the same as that of FIG. 3(4), in FIG. 7(6), numerical numbers 6, 8a, and 8b are the same as those of FIG. 3(5), respectively, and in FIG. 7(7), the numerical numbers are the same as FIG. 1(b).

Example 5

<<Preparation of Thin-film Transistor Sample 5>>

Thin-film transistor sample 5 was prepared in the same manner as in thin-film transistor sample 1, except that an intermediate layer 3a as shown in FIG. 8(5) was provided between the organic semiconductor layer 3 and the insulating area 6.

In the above, the intermediate layer 3a was formed as follows:

Gate electrode 2, gate insulating layer 2a, and organic semiconductor layer 3 were provided on a substrate 1 in the same manner as in Procedure 1 of Example 1 to obtain a layer structure as shown in FIG. 8(1).

An ultra pure water solution of PVA was coated employing a die coater on the organic semiconductor layer, and dried to form a PVA layer with a thickness of 0.5 μm as intermediate layer 3a as shown in FIG. 8(2). Further, ink droplet 6a was ejected as shown in FIG. 8(3), and insulating area 6 was formed in the same manner as in Example 4, hardened, and washed with ultra pure water to remove a PVA layer at portions other than the insulating area, as shown in FIG. 8(4).

In FIG. 8(5), 8(6), 8(7) and 8(8), numerical number 1 shows a substrate, numerical number 2a shows a gate insulating layer, numerical number 3 shows a semiconductor layer, numerical number 3a shows an intermediate layer, numerical number 6 shows insulating area, numerical numbers 8, 8a and 8b show ink droplets for forming drain electrode 4 and source electrode 5.

The resulting sample 5 exhibited good operation property as a p-channel enhancement type FET, and provided the same characteristic values as sample 1 of Example 1.

FIG. 1(c) and FIG. 8(8) have the same structure.

Example 6

<<Preparation of Thin-film Transistor Sample 6>>

Thin-film transistor sample 6 was prepared in the same manner as in thin-film transistor sample 5, except that an aqueous solution containing PVA and carbon black in the same amount was employed to form an intermediate layer with a thickness of 1 μm.

The resulting sample 6 exhibited good operation property as a p-channel enhancement type FET and provided the same characteristic values as sample 1 of Example 1. Light transmittance of the insulating area 6 of this sample 6 was 0.25, and when the sample was operated under a fluorescent lamp of 2000 Lux, its property did not vary.

Example 1-1

A thin-film transistor sheet 1 having a structure as shown in FIGS. 11 through 14 was prepared as follows.

<<Preparation of Thin-film Transistor Sheet 1>>

Procedure (1)

Gate busline 11 (when the gate busline serves also as a gate electrode, the gate electrode is not illustrated) and an organic thin-film transistor layer 3 were provided on the substrate 1 (not illustrated) as follows.

(Preparation of Substrate 1)

The substrate 1 with a subbing layer was prepared in the same manner as in Example 1.

(Formation of Gate Electrode)

The light sensitive resin layer 1 used in Example 1 was coated on the substrate 1, and dried at 100° C. for 1 minute to form a light sensitive resin layer with a thickness of 2 μm in the same manner as in Example 1.

The light sensitive resin layer was exposed at an energy density of 200 mJ/cm$^2$ employing a 100 mW semiconductor laser emitting 830 nm light to give a gate busline pattern and a gate electrode pattern, and developed with an alkali developing solution to form a resist.

A 300 nm thick aluminum layer was formed on the entire surface of the developed material according to a sputtering method, and the resist was removed with MEK to obtain a gate busline 11 and a gate electrode 2.

(Formation of Anodization Film)

The resulting material was sufficiently washed, and anodized in an aqueous 50 g/liter ammonium borate solution by supplying direct current for 5 minutes through a 100V constant voltage power source to give an anodization film (not illustrated). The resulting layer was sufficiently washed with ultra pure water.

(Formation of Gate Insulating Layer)

The resulting layer was subjected to atmospheric pressure plasma discharge treatment at 200° C. to obtain a 30 nm thick titanium oxide layer (a gate insulating layer not illustrated) in the same manner as in Example 1.

(Formation of Organic Semiconductor Layer)

A chloroform solution of Compound C used in Example 1 was ejected onto a portion of the gate insulating layer (not illustrated) where channel was to be formed, employing a piezo type ink jet printer, dried at 50° C. for 3 minutes, and heated at 200° C. for 10 minutes to obtain an organic semiconductor layer 3 of a 50 nm thick pentacene film.

Procedure (2): Formation of Insulating Areas 6, A and B

A silicone adhesive SE9185 (produced by Toray Dow Corning silicone Co., Ltd.) was provided on the organic semiconductor layer 3 according to a screen printing method, and hardened at 50° C. to obtain insulating areas 6, A, and B, each being comprised of a silicone rubber layer with a thickness of 3 μm and a width of 20 μm.

Procedure 3: Formation of Source Electrode, Drain Electrode, Pixel Electrode and Source Busline An aqueous dispersion (BAYTRON P produced by Bayer Co., Ltd.) of polystyrene sulfonic acid and poly(ethylenedioxy-thiophene) was added with 0.01% by weight of non-ionic surfactant (NP15, produced by Nikko Chemicals Co., Ltd.) to obtain an electrode material, and the resulting electrode material was coated on the insulating areas 6, line A and line B, separated by the insulating areas, and then dried at 60° C. to form a layer of the electrode material with a thickness of 2 μm. Further, a silver paste was coated on the resulting material, separated by the insulating areas, dried at 60° C., and then heat treated at 200° C. to form a silver paste layer with a thickness of 2 μm. Thus, source electrode 20, drain electrode 21, pixel electrode 21 and source busline 20 are formed.

The thin-film transistor sheet 1 prepared according to the above procedures exhibited a good operation property.

Example 1-2

<<Preparation of Thin-film Transistor Sheet 2>>

Thin-film transistor sheet 2 was prepared in the same manner as in thin-film transistor sheet 1 of Example 1-1, except that formation of the organic semiconductor layer was carried out as follows:

(Formation of Organic Semiconductor Layer)

A chloroform solution of regioregular poly(3-hexylthiophene), (produced by Ardrich Co., Ltd.), which had been purified to have a Zn and Ni content of not more than 10 ppm, was prepared. This solution was ejected employing a piezo type ink jet printer, dried at room temperature and heat treated at 50° C. for 30 minutes in a nitrogen atmosphere to form an organic semiconductor layer of poly(3-hexylthiophene) with a thickness of 30 nm.

Thus, the thin-film transistor sheet 2 (inventive) was obtained, and exhibited a good operation property.

Example 1-3

<<Preparation of Thin-film Transistor Sheet 3>>

Thin-film transistor sheet 3 was prepared in the same manner as in thin-film transistor sheet 1 of Example 1-1, except that after the semiconductor layer formation, the following procedures were carried out.

(Formation of Intermediate (a 0.3 μm Thick PVA Layer) Layer)

An aqueous polyvinyl alcohol solution was coated on the organic semiconductor layer 3, and dried at 100° C. in a nitrogen atmosphere to form an intermediate layer comprised of polyvinyl alcohol. Herein, the aqueous polyvinyl alcohol solution was one in which polyvinyl alcohol sufficiently purified was dissolved in water purified with ultra pure water manufacturing apparatus.

<<Formation of Insulating Areas 6, A, and B>>

A silicone rubber solution, in which the following composition 2 was dissolved in Isopar E (isoparaffin type hydrocarbon, produced by Exxon Co. Ltd.) to give a solid content of 10.3% by weight, was ejected, as ink droplets, on the resulting intermediate layer according to an ink jet method, dried and hardened to form insulating areas 6, A and B each having a width of 7 μm and a thickness of 0.4 μm comprised of silicone rubber in the ink receptive layer 7, as shown in FIG. 7(4).

(Composition 2)

| | |
|---|---|
| α, ω-Divinylpolydimethylsiloxane (Molecular weight 60,000)] | 100 parts |
| HMS-501 (Methylhydrogensiloxane-dimethylsiloxane copolymer having methyl groups on the chain ends, SiH number/molecular weight = 0.69 mol/g, produced by Chisso Co., Ltd.) | 7 parts |
| Vinyltris(methylethylketoxyimino)silane | 3 parts |
| SRX-212 (platinum catalyst, produced by Toray Dow Corning Silicone Co., Ltd.) | 5 parts |

The intermediate layer on which the insulating areas were not provided was removed with water, and sufficiently washed with ultra pure water.

Subsequently, electrode material was supplied to the resulting material in the same manner as in Example 2-1 to obtain a two-layered electrode. Thus, the thin-film transistor sheet 3 (inventive) was obtained, and exhibited a good operation property.

Example 2-1

<Preparation of Substrate 101>

A mixture of 3.04 g (20 mmol) of tetramethoxysilane, 1.52 g of methylene chloride, and 1.52 g of ethanol was mixed with 0.72 g of an aqueous 0.5% by weight nitric acid solution for hydrolysis, and stirred at room temperature for one hour.

A solution in which 1.60 g of diacetylcellulose L50 (produced by Daicel Co., Ltd.) was dissolved in a mixed solvent of 5.3 g of ethanol and 60.9 g of methyl acetate was added to the resulting mixture above, and stirred for one hour to obtain a dope. The resulting dope was cast on a moving gum belt through a doctor blade with a gap width of 800 μm, and dried at 120° C. for 30 minutes to obtain a substrate 1 with a thickness of 200 μm. The substrate 1 had a Tg of 226° C., which was obtained by dynamic viscoelastic measurement.

The surface of substrate 101 was corona discharged at 50 W/m²/min and then coated with a coating liquid having the following composition to obtain a layer of a dry thickness of 2 μm. The resulting layer was dried at 50° C. for 5 minutes, and hardened by being exposed for 4 seconds employing a 60 W/cm high pressure mercury lamp 10 cm distant from the layer.

| | |
|---|---|
| Dipentaerythritol hexacrylate monomer | 60 g |
| Dipentaerythritol hexacrylate dimmer | 20 g |
| Dipentaerythritol hexacrylate trimer or polymer higher than the trimer | 20 g |
| Diethoxybenzophenone (UV-initiator) | 2 g |
| Silicon-containing surfactant | 1 g |
| Methyl ethyl ketone | 75 g |
| Methyl propylene glycol | 75 g |

The resulting hardened layer was subjected to continuous atmospheric pressure plasma treatment under the following condition to give a 50 nm thick silicon oxide layer on the hardened layer. This layer was a subbing layer 102. Thus, a substrate 101 with a subbing layer 102, as shown in FIG. 15(1), was obtained (Gas Used)

| | |
|---|---|
| Inert gas: Helium | 98.25% by volume |
| Reactive gas 1: an oxygen gas | 1.5% by volume |
| Reactive gas 2: tetraethoxysilane vapor (bubbled with a helium gas) | 0.25% by volume |
| (Condition of discharge) | |
| Discharge output power: | 10 W/cm² |

(Condition of Electrodes)

Electrodes used were prepared as follows:

A stainless steel jacket roll base material having a cooling device (not illustrated in FIG. 2) employing chilled water was coated with an alumina thermal spray layer. After that, a solution prepared by diluting tetramethoxysilane with ethyl acetate was coated on the resulting electrode, dried, hardened by UV ray irradiation to carry out sealing treatment, and smoothed to give an dielectric layer (dielectric constant: 10) with an Rmax of 5 μm on the surface of the material. Thus, a roll electrode was obtained. Further, a hollow prismatic stainless steel pipe was processed in the same manner as above to obtain a hollow prismatic electrode as a voltage application electrode. The roll electrode was grounded.

<Formation of Insulating Area (Electrode Material-repellent Area>

A silicone rubber solution, in which the following composition 2 was dissolved in Isopar E (isoparaffin type hydrocarbon, produced by Exxon Co. Ltd.) to give a solid content of 10.3% by weight, was ejected, as ink droplets, on the subbing layer 102 formed on the substrate 101 according to an ink jet method, and dried to form an insulating area 108 with a thickness of 0.4 μm comprised of silicone rubber, as shown in FIG. 15(2).

(Composition 2)

| | |
|---|---|
| α, ω-Divinylpolydimethylsiloxane (Molecular weight 60,000)] | 100 parts |
| HMS-501 (Methylhydrogensiloxane-dimethylsiloxane copolymer having methyl groups on the chain ends, SiH number/molecular weight = 0.69 mol/g, produced by Chisso Co., Ltd.) | 7 parts |
| Vinyltris(methylethylketoxyimino)silane | 3 parts |
| SRX-212 (platinum catalyst, produced by Toray Dow Corning Silicone Co., Ltd.) | 5 parts |

<Formation of Electrode>

A dispersion containing silver particles with an average particle size of 8 nm, prepared according to a method disclosed in Japanese Patent O.P.I. Publication No. 11-80647, was coated on the resulting material employing a roll coater, wherein the dispersion was adhered only to the portions other than the insulating area 108 in the form of electrode, and dried at 200° C. for 15 minutes to form an electrode 120, as shown in FIG. 15(3). Thus, an electric circuit was obtained. The resulting electric circuit exhibited a good electrode pattern.

Example 2-2

<Preparation of Substrate 101>

Substrate 101 with a subbing layer 102 was prepared in the same manner as in Example 2-1 above, as shown in FIG. 16(1).

(Formation of Light Sensitive Layer)

The following composition 1 was kneaded, then added with 5.90 parts of a polyisocyanate compound (Colonate 3041 containing 50% of an effective component, produced by Nippon Polyurethane Kogyo Co., Ltd.), and further stirred in a dissolver to obtain a coating solution 1.

Composition 1

| | |
|---|---|
| Fe—Al ferromagnetic metal powder (Fe:Al = 100:4 by atom number, average major axis length: 0.14 µm) | 100 parts |
| Vinyl chloride resin (MR-110, produced by Nippon Zeon Co., Ltd.) | 10.0 parts |
| Urethane resin (Vylon UR-8200, produced by Toyobo Co., Ltd.) | 5.0 parts |
| Phosphate (Phosphanol RE-610, produced by Toho Kagaku Co., Ltd.) | 3.0 parts |
| Methyl ethyl ketone | 105.0 parts |
| Toluene | 105.0 parts |
| Cyclohexanone | 90.0 parts |

The resulting coating solution 1 was coated on the subbing layer 102 formed on the substrate 101, and dried at 100° C. for 5 minutes to obtain a light sensitive layer 107 with a thickness of 0.3 µm, as shown in FIG. 16(2).

The silicone rubber solution used in Example 1-1 was coated on the light sensitive layer 107, and dried to form an electrode material-repellent layer (an insulating layer) 108' with a thickness of 0.4 µm comprised of silicone rubber, as shown in FIG. 16(3).

(Exposure and Development of Light Sensitive Layer)

The resulting material was exposed at an exposure energy density of 200 mJ/cm$^2$ employing a semiconductor laser with an output power of 100 mW emitting a 830 nm light, whereby adhesion between the light sensitive layer 107 and the insulating layer 108' varied, and developed with a brush, whereby the silicone rubber layer (the insulating layer 108') at exposed portions was removed to form an electrode pattern, as shown in FIG. 16(4).

(Formation of Electrode)

A dispersion containing silver particles with an average particle size of 8 nm, prepared according to a method disclosed in Japanese Patent O.P.I. Publication No. 11-80647, was coated on the resulting material employing a roll coater, wherein the dispersion was adhered only to the portions at which the silicone rubber layer at exposed portions was removed in the form of electrode, and dried at 200° C. for 15 minutes to form an electrode 120, as shown in FIG. 16(5). Thus, an electric circuit was obtained.

The resulting electric circuit exhibited a good electrode pattern.

Example 2-3

(Preparation and Evaluation of Organic Thin-film Transistor)

The following procedures were carried out employing the substrate 101 with subbing layer 102 obtained above to obtain an organic thin-film transistor.

(Formation of Gate Electrode)

The light sensitive resin layer 1 used in Example 1 above was coated on the subbing layer 102 of the substrate 102 above in the same manner as in Example 1 to obtain a light sensitive resin layer with a thickness of 2 µm.

The light sensitive resin layer was exposed at an energy density of 200 mJ/cm$^2$ employing a 100 mW semiconductor laser emitting 830 nm light to give a gate electrode pattern, and developed with an alkali developing solution to form a resist.

A 300 nm thick aluminum layer was formed on the entire surface of the developed material according to a sputtering method, and the resist was removed with MEK to obtain a gate electrode 10, as shown in FIG. 17(1).

(Formation of Anodization Film)

The resulting material was sufficiently washed, and anodized in an aqueous 30% by weight sulfuric acid solution by supplying direct current for 2 minutes through a 30V constant voltage power source to give an anodization film 119 with a thickness of 120 nm as shown in FIG. 17(1). The resulting film was sufficiently washed with ultra pure water, and subjected to vapor sealing treatment in a chamber saturated with 100° C. vapor at 1 atmosphere.

(Formation of Gate Insulating Layer)

The resulting layer was subjected to atmospheric pressure plasma discharge treatment at 200° C. to obtain a 30 µm thick titanium oxide layer, a gate insulating layer 109 as shown in FIG. 17(2), in the same manner as above, except that the following gas was used.

(Gas Used)

| | |
|---|---|
| Inert gas: Helium | 98.9% by volume |
| Reactive gas 1: an oxyen gas | 0.8% by volume |
| Reactive gas 2: tetraethoxysilane vapor (bubbled with argon gas at 150° C.) | 0.3% by volume |

(Formation of Organic Semiconductor Layer)

A chloroform solution of Compound C described later was ejected onto a portion of the gate insulating layer 2a where channel was to be formed, employing a piezo type ink jet printer, dried at 50° C. for 3 minutes, and heated at 200° C. for 10 minutes to obtain an organic semiconductor layer 3 of a 50 nm thick pentacene film, as shown in FIG. 17(3).

<Formation of Organic Semiconductor Layer Protective Layer>

An aqueous polyvinyl alcohol solution, in which purified polyvinyl alcohol was dissolved in water sufficiently purified employing a super pure water manufacturing apparatus, was coated on the organic semiconductor layer 3, and dried at 100° C. in a nitrogen atmosphere to obtain an organic semiconductor layer protective layer 103 as shown in FIG. 17(4) of polyvinyl alcohol with a thickness of 1 µm.

(Formation of Light Sensitive Layer)

The following compositions A and B were individually kneaded, and the kneaded composition A, B, and polyisocyanante compound described above were mixed in a ratio by weight of 100:2.39:0.37, and further stirred in a dissolver to obtain a coating solution.

The resulting coating solution 1 was further ultrasonic dispersed, coated on the protective layer 103 employing an extrusion coater, and dried at 100° C. for 5 minutes to obtain a light sensitive layer 107 with a thickness of 0.3 µm, as shown in FIG. 17(5).

| Composition A | |
|---|---|
| Fe—Al ferromagnetic metal powder | 100 parts |
| Polyrethane resin (Vylon UR-8200, produced by Toyobo Co., Ltd.) | 10.0 parts |
| Polyester resin (Vylon 280, produced by Toyobo Co., Ltd.) | 5.0 parts |
| Phosphoric acid ester | 3.0 parts |
| Methyl ethyl ketone | 105.0 parts |
| Toluene | 105.0 parts |
| Cyclohexanone | 90.0 parts |
| Composition B | |
| α-Alumina (High purity alumina HIT60G, average particles size: 0.18 μm, produced by Sumitomo Kagaku Co., Ltd.) | 100 parts |
| Polyrethane resin (Vylon UR-8700, produced by Toyobo Co., Ltd.) | 15.0 parts |
| Phosphoric acid ester | 3.0 parts |
| Methyl ethyl ketone | 41.3 parts |
| Toluene | 41.3 parts |
| Cyclohexanone | 35.4 parts |

The silicone rubber solution obtained above was coated on the light sensitive layer 107, and dried to form an electrode material-repellent layer (an insulating layer) 108' with a thickness of 0.4 μm comprised of silicone rubber, as shown in FIG. 17(6).

(Exposure and Development of Light Sensitive Layer)

The resulting material was exposed at an exposure energy density of 300 mJ/cm$^2$ employing a semiconductor laser with an output power of 100 mW emitting a 830 nm light, and developed with a brush, whereby the silicone rubber layer (the insulating layer 18') at exposed portions was removed to form a source and drain electrode pattern, as shown in FIG. 17(7).

<Removal of Organic Semiconductor Layer Protective Layer>

The resulting material was further washed with water to remove the light sensitive layer and polyvinyl alcohol protective layer at the exposed portions, as shown in FIG. 17(7).

(Formation of Source and Drain Electrodes)

An aqueous dispersion (BAYTRON P produced by Bayer Co., Ltd.) of polystyrene sulfonic acid and poly(ethylenedioxythiophene) was coated on the resulting material employing a roll coater, wherein the dispersion was adhered only to the portions at which the silicone rubber layer at exposed portions was removed in the form of electrode, and then dried at 100° C. Further, a dispersion containing silver particles with an average particle size of 8 nm, prepared according to a method disclosed in Japanese Patent O.P.I. Publication No. 11-80647, was coated on the resulting material employing a roll coater, wherein the dispersion was adhered only to the portions at which the silicone rubber layer at exposed portions was removed in the form of electrode, and dried at 200° C. for 15 minutes to form a source electrode 5 and a drain electrode 4, as shown in FIG. 17(8). The resulting electrodes were comprised of a 20 nm layer of polystyrene sulfonic acid and poly(ethylene-dioxythiophene) and a 300 nm Ag particle layer. Thus, an organic thin-film transistor was obtained.

Figure 18:
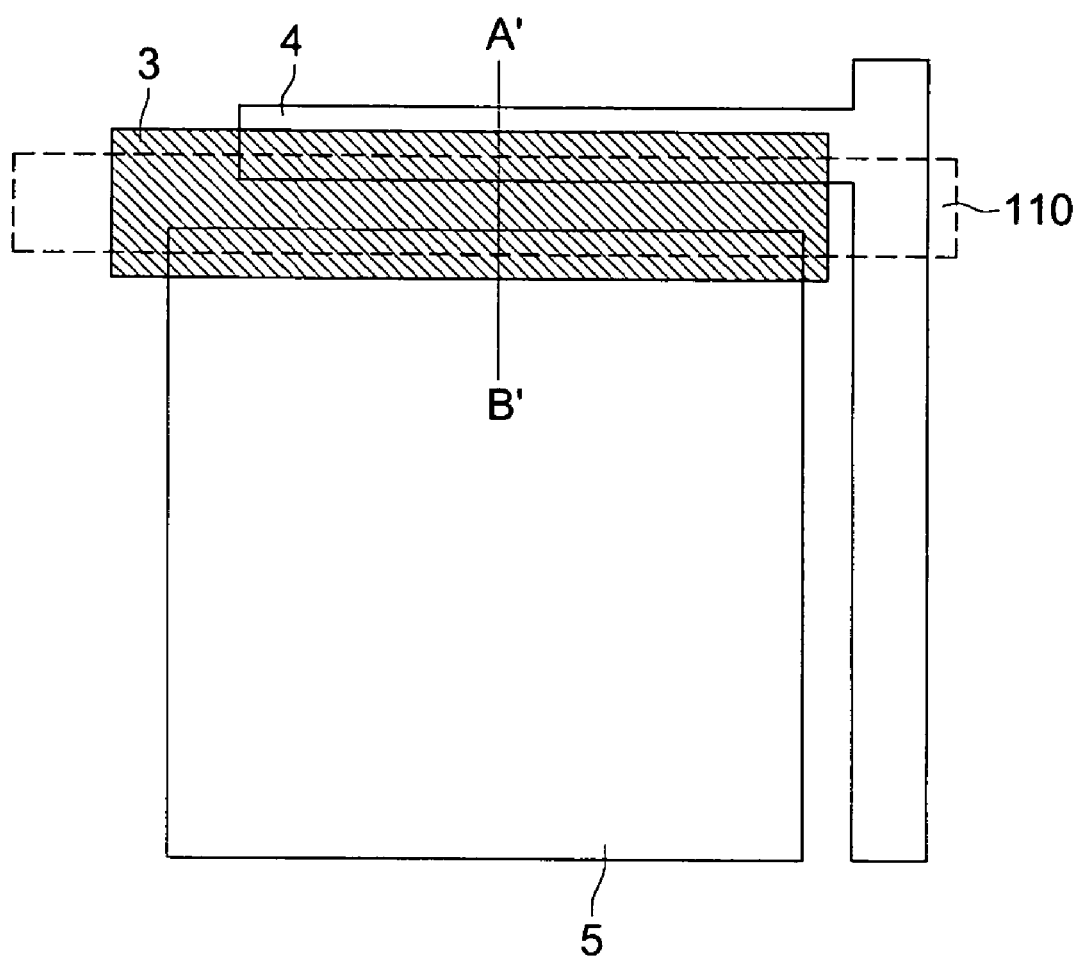
FIG. 18 is an illustration showing a structural example of a thin-film transistor.

FIG. 17(8) shows the organic thin-film transistor obtained above. FIG. 17(8) shows a sectional view of line A'B' of FIG. 18.

The organic thin-film transistor obtained above exhibited a good operation property as a p channel enhancement type FET.

EFFECT OF THE INVENTION

The present invention provides a method of easily and efficiently manufacturing a thin-film transistor, a thin-film transistor sheet and an electrical circuit, each having high accuracy, without employing a vacuum system process, and further provides a method of stably manufacturing a thin-film transistor a thin-film transistor sheet and an electrical circuit which minimize fluctuation of their performance.

What is claimed is:

1. A method of manufacturing a thin-film transistor comprising a substrate, and provided thereon, a gate electrode, a gate insulating layer, a semiconductor layer, a source electrode and a drain electrode, the method comprising:
   a) forming the gate insulating layer on the substrate;
   b) providing a semiconductive material on the gate insulating layer to form the semiconductor layer on the gate insulating layer;
   c) providing an electrode material-repellent material onto the semiconductor layer to form on the semiconductor layer a first area on which the electrode material-repellent material is provided and second and third areas on which the electrode material-repellent material is not provided, whereby an insulating area comprised of the electrode material-repellent material is formed on the first area, the second area being on one end of the first area and the third area on the other end of the first area; and then
   d) providing an electrode material onto the insulating area, whereby the electrode material is separated by the insulating area to form a source electrode on the second area of one end of the insulating area and a drain electrode on the third area of the other end of the insulating area.

2. The method of claim 1, wherein the insulating area is comprised of a silicone rubber layer.

3. The method of claim 1, wherein the thickness of the insulating area is from 0.05 to 10 μm.

4. The method of claim 1, wherein the providing of the electrode material-repellent material is carried out by an ink jet method.

5. The method of claim 1, wherein the providing of the electrode material is carried out by an ink jet method.

6. The method of claim 5, wherein the electrode material is contained in a solvent or a dispersion medium containing 50% by weight of water.

7. The method of claim 1, wherein the semiconductor layer is an organic semiconductor layer containing an organic semiconductive material.

8. The method of claim 1, wherein the substrate is a resin sheet comprised of a resin.

* * * * *